(12) United States Patent
Cheng et al.

(10) Patent No.: US 10,977,973 B1
(45) Date of Patent: Apr. 13, 2021

(54) DISPLAY DEVICE AND ASSOCIATED DETECTION METHOD

(71) Applicant: NOVATEK MICROELECTRONICS CORP., HsinChu (TW)

(72) Inventors: Yen-Cheng Cheng, Hsinchu (TW); Hsiu-Hui Yang, Hsinchu (TW)

(73) Assignee: NOVATEK MICROELECTRONICS CORP., Hsinchu (TW)

(*) Notice: Subject to any disclaimer, the term of this patent is extended or adjusted under 35 U.S.C. 154(b) by 90 days.

(21) Appl. No.: 16/582,097

(22) Filed: Sep. 25, 2019

(51) Int. Cl.
- G09G 3/00 (2006.01)
- G09G 3/20 (2006.01)
- G01R 31/28 (2006.01)

(52) U.S. Cl.
CPC ......... G09G 3/006 (2013.01); G01R 31/2825 (2013.01); G09G 3/20 (2013.01); G09G 2310/0275 (2013.01); G09G 2310/08 (2013.01); G09G 2330/04 (2013.01); G09G 2330/12 (2013.01)

(58) Field of Classification Search
CPC ...... G09G 3/006; G09G 3/20; G09G 2310/08; G09G 2330/04; G09G 2330/12; G09G 2310/0275; G01R 31/2825
See application file for complete search history.

(56) References Cited

U.S. PATENT DOCUMENTS

| 2015/0187244 A1* | 7/2015 | Yang | G01R 31/50 324/760.02 |
| 2015/0325158 A1* | 11/2015 | Shao | G02F 1/136259 324/750.3 |
| 2016/0180754 A1* | 6/2016 | Chen | G02F 1/136213 324/760.01 |

* cited by examiner

*Primary Examiner* — Giovanni Astacio-Oquendo
(74) *Attorney, Agent, or Firm* — McClure, Qualey & Rodack, LLP

(57) ABSTRACT

A display device and a detection method applied to the display device are provided. The display device includes a display panel, a source control circuit, and a leakage estimation circuit. The display panel includes pixels being arranged in M columns, wherein at least one panel-partition is defined on the display panel. The source control circuit includes M source drivers which respectively provide data voltages to the M columns of pixels. The leakage estimation circuit includes an evaluation circuit, a defect detection circuit, and a mode-switch. The evaluation circuit controls the defect detection circuit to perform a leakage estimation procedure so that a leakage current corresponding to the panel-partition is estimated when the at least one mode-switch is turned on.

20 Claims, 15 Drawing Sheets

| origTbl | Sdet_orig (pt, tstC) | | | | origTbl | Sdet_orig (pt, tstC) | | | |
|---|---|---|---|---|---|---|---|---|---|
| panel-partition | 1 | 2 | 3 | 4 | panel-partition | 1 | 2 | 3 | 4 |
| 0.5mA | 0 | 0 | 0 | 0 | 16.5mA | 1 | 1 | 1 | 1 |
| 1mA | 0 | 0 | 0 | 0 | 17mA | 1 | 1 | 1 | 1 |
| 1.5mA | 0 | 0 | 0 | 0 | 17.5mA | 1 | 1 | 1 | 1 |
| 2mA | 0 | 0 | 0 | 0 | 18mA | 1 | 1 | 1 | 1 |
| 2.5mA | 1 | 0 | 0 | 0 | 18.5mA | 1 | 1 | 1 | 1 |
| 3mA | 1 | 1 | 1 | 0 | 19mA | 1 | 1 | 1 | 1 |
| 3.5mA | 1 | 1 | 1 | 1 | 19.5mA | 1 | 1 | 1 | 1 |
| 4mA | 1 | 1 | 1 | 1 | 20mA | 1 | 1 | 1 | 1 |
| 4.5mA | 1 | 1 | 1 | 1 | 20.5mA | 1 | 1 | 1 | 1 |
| 5mA | 1 | 1 | 1 | 1 | 21mA | 1 | 1 | 1 | 1 |
| 5.5mA | 1 | 1 | 1 | 1 | 21.5mA | 1 | 1 | 1 | 1 |
| 6mA | 1 | 1 | 1 | 1 | 22mA | 1 | 1 | 1 | 1 |
| 6.5mA | 1 | 1 | 1 | 1 | 22.5mA | 1 | 1 | 1 | 1 |
| 7mA | 1 | 1 | 1 | 1 | 23mA | 1 | 1 | 1 | 1 |
| 7.5mA | 1 | 1 | 1 | 1 | 23.5mA | 1 | 1 | 1 | 1 |
| 8mA | 1 | 1 | 1 | 1 | 24mA | 1 | 1 | 1 | 1 |
| 8.5mA | 1 | 1 | 1 | 1 | 24.5mA | 1 | 1 | 1 | 1 |
| 9mA | 1 | 1 | 1 | 1 | 25mA | 1 | 1 | 1 | 1 |
| 9.5mA | 1 | 1 | 1 | 1 | 25.5mA | 1 | 1 | 1 | 1 |
| 10mA | 1 | 1 | 1 | 1 | 26mA | 1 | 1 | 1 | 1 |
| 10.5mA | 1 | 1 | 1 | 1 | 26.5mA | 1 | 1 | 1 | 1 |
| 11mA | 1 | 1 | 1 | 1 | 27mA | 1 | 1 | 1 | 1 |
| 11.5mA | 1 | 1 | 1 | 1 | 27.5mA | 1 | 1 | 1 | 1 |
| 12mA | 1 | 1 | 1 | 1 | 28mA | 1 | 1 | 1 | 1 |
| 12.5mA | 1 | 1 | 1 | 1 | 28.5mA | 1 | 1 | 1 | 1 |
| 13mA | 1 | 1 | 1 | 1 | 29mA | 1 | 1 | 1 | 1 |
| 13.5mA | 1 | 1 | 1 | 1 | 29.5mA | 1 | 1 | 1 | 1 |
| 14mA | 1 | 1 | 1 | 1 | 30mA | 1 | 1 | 1 | 1 |
| 14.5mA | 1 | 1 | 1 | 1 | 30.5mA | 1 | 1 | 1 | 1 |
| 15mA | 1 | 1 | 1 | 1 | 31mA | 1 | 1 | 1 | 1 |
| 15.5mA | 1 | 1 | 1 | 1 | 31.5mA | 1 | 1 | 1 | 1 |
| 16mA | 1 | 1 | 1 | 1 | 32mA | 1 | 1 | 1 | 1 | c1 → origLkg(PT1)=3mA
c2 → origLkg(PT2)=3.5mA
c3 → origLkg(PT3)=3.5mA
c4 → origLkg(PT4)=4mA
refLkg=3mA

FIG. 24A

| | newTbl | Sdet_new (pt, tstC) | | | | newTbl | Sdet_New (pt, tstC) | | | |
|---|---|---|---|---|---|---|---|---|---|---|
| | panel-partition | 1 | 2 | 3 | 4 | panel-partition | 1 | 2 | 3 | 4 |
| | 0.5mA | 0 | 0 | 0 | 0 | 16.5mA | 1 | 1 | 1 | 0 |
| | 1mA | 0 | 0 | 0 | 0 | 17mA | 1 | 1 | 1 | 0 |
| | 1.5mA | 0 | 0 | 0 | 0 | 17.5mA | 1 | 1 | 1 | 0 |
| c1' | 2mA | 0 | 0 | 0 | 0 | 18mA | 1 | 1 | 1 | 0 |
| | 2.5mA | 1 | 0 | 0 | 0 | 18.5mA | 1 | 1 | 1 | 0 |
| | 3mA | 1 | 0 | 1 | 0 | 19mA | 1 | 1 | 1 | 0 |
| | 3.5mA | 1 | 0 | 1 | 0 | 19.5mA | 1 | 1 | 1 | 0 |
| | 4mA | 1 | 0 | 1 | 0 | 20mA | 1 | 1 | 1 | 0 |
| | 4.5mA | 1 | 0 | 1 | 0 | 20.5mA | 1 | 1 | 1 | 0 |
| | 5mA | 1 | 0 | 1 | 0 | 21mA | 1 | 1 | 1 | 0 |
| c2' | 5.5mA | 1 | 0 | 1 | 0 | 21.5mA | 1 | 1 | 1 | 0 |
| | 6mA | 1 | 1 | 1 | 0 | 22mA | 1 | 1 | 1 | 0 |
| | 6.5mA | 1 | 1 | 1 | 0 | 22.5mA | 1 | 1 | 1 | 0 |
| | 7mA | 1 | 1 | 1 | 0 | 23mA | 1 | 1 | 1 | 0 |
| | 7.5mA | 1 | 1 | 1 | 0 | 23.5mA | 1 | 1 | 1 | 0 |
| Isrc | 8mA | 1 | 1 | 1 | 0 | 24mA | 1 | 1 | 1 | 0 |
| | 8.5mA | 1 | 1 | 1 | 0 | 24.5mA | 1 | 1 | 1 | 0 |
| | 9mA | 1 | 1 | 1 | 0 | 25mA | 1 | 1 | 1 | 0 |
| | 9.5mA | 1 | 1 | 1 | 0 | 25.5mA | 1 | 1 | 1 | 0 |
| | 10mA | 1 | 1 | 1 | 0 | 26mA | 1 | 1 | 1 | 0 |
| | 10.5mA | 1 | 1 | 1 | 0 | 26.5mA | 1 | 1 | 1 | 0 |
| | 11mA | 1 | 1 | 1 | 0 | 27mA | 1 | 1 | 1 | 0 |
| | 11.5mA | 1 | 1 | 1 | 0 | 27.5mA | 1 | 1 | 1 | 0 |
| | 12mA | 1 | 1 | 1 | 0 | 28mA | 1 | 1 | 1 | 0 |
| | 12.5mA | 1 | 1 | 1 | 0 | 28.5mA | 1 | 1 | 1 | 0 |
| | 13mA | 1 | 1 | 1 | 0 | 29mA | 1 | 1 | 1 | 0 |
| | 13.5mA | 1 | 1 | 1 | 0 | 29.5mA | 1 | 1 | 1 | 0 |
| | 14mA | 1 | 1 | 1 | 0 | 30mA | 1 | 1 | 1 | 0 |
| | 14.5mA | 1 | 1 | 1 | 0 | 30.5mA | 1 | 1 | 1 | 1 |
| | 15mA | 1 | 1 | 1 | 0 | 31mA | 1 | 1 | 1 | 1 |
| | 15.5mA | 1 | 1 | 1 | 0 | 31.5mA | 1 | 1 | 1 | 1 |
| | 16mA | 1 | 1 | 1 | 0 | 32mA | 1 | 1 | 1 | 1 | c1' → newLkg(PT1)=3mA
c2' → newLkg(PT2)=6.5mA
c3' → newLkg(PT3)=3.5mA
c4' → newLkg(PT4)=31mA
majLkg is not available

FIG. 24B

US 10,977,973 B1

DISPLAY DEVICE AND ASSOCIATED DETECTION METHOD

TECHNICAL FIELD

The disclosure relates in general to a display device and associated detection method, and more particularly to a display device and associated detection method capable of determining whether a short circuit occurs at a display panel.

BACKGROUND

FIG. 1 (prior art) is a schematic diagram showing an intact display panel. When a display panel 11 is intact, images can be displayed properly. When the display panel 11 is cracked, the display panel 11 can no longer display images properly, and the display panel 11 might be burnt out.

FIG. 2 (prior art) is a schematic diagram showing a break BRK on a cracked display panel. In daily use, the display panel 13 might be cracked by an external force so that a break BRK might appear on the surface of the display panel 13. The external force, for example, might be caused by a pellet of an airsoft gun accidentally shot by a child. In other words, the display panel 13 is cracked because of the shot. On the display panel 13, a short circuit might exist at the position of break BRK. However, the break BRK can be extremely tiny so that a user might not be aware that such a tiny break BRK may put the display panel 13 at the risk of being burnt out. Therefore, a detection mechanism for identifying whether the display panel 13 has a short circuit is required.

SUMMARY

The disclosure is directed to a display device and associated detection method capable of determining whether a display panel has a break. When a detection result shows that the estimated leakage is abnormal, the display panel is determined to have a short circuit. Consequentially, the display panel is determined as being cracked.

According to one embodiment, a display device is provided. The display device includes a display panel, a source control circuit, and a leakage estimation circuit. The display panel includes a plurality of pixels being arranged in M columns, wherein at least one panel-partition is defined on the display panel. The source control circuit is electrically connected to the display panel. The source control circuit includes M source drivers, which respectively provide data voltages to the M columns of pixels. The leakage estimation circuit includes an evaluation circuit, a defect detection circuit, and at least one mode-switch. The defect detection circuit is electrically connected to the evaluation circuit. At least one mode-switch is electrically connected to the defect detection circuit and the source control circuit. The evaluation circuit controls the defect detection circuit to perform a leakage estimation procedure so that a leakage current corresponding to the at least one panel-partition is estimated when the at least one mode-switch is turned on.

According to another embodiment, a detection method applied to a display panel is provided. The detection method includes the following steps. Firstly, at least one mode-switch is turned one. Then, a leakage estimation procedure is performed to estimate a leakage current corresponding to at least one panel-partition. Later, the leakage estimation circuit is controlled to perform a leakage estimation procedure so that the leakage current is estimated.

BRIEF DESCRIPTION OF THE DRAWINGS

FIG. 24A is a schematic diagram illustrating that 32 testing current values represented by the current setting signal Sset having a length of 6-bits are utilized for constructing the original comparison table origTbl.

FIG. 24B is a schematic diagram illustrating that 32 testing current values represented by the current setting signal Sset having a length of 6-bits are utilized for constructing the new comparison table newTbl.

Figure 1:
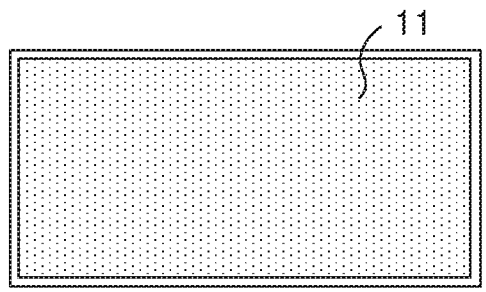
FIG. 1 (prior art) is a schematic diagram showing an intact display panel.
Figure 2:
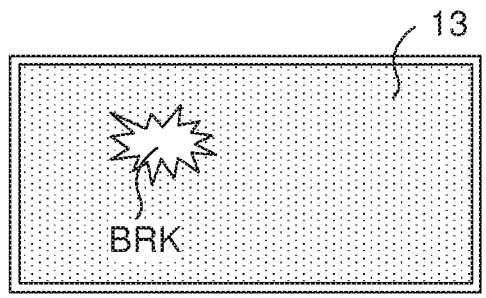
FIG. 2 (prior art) is a schematic diagram showing a cracked display panel.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

To prevent the display device from being burnt out, a leakage estimation circuit is provided. The leakage estimation circuit performs a leakage estimation procedure to estimate leakage current corresponding to the display panel. When the leakage estimated results indicate that the leakage current corresponding to the display panel is abnormal, the leakage estimation circuit generates a warning message accordingly.

Figure 3:
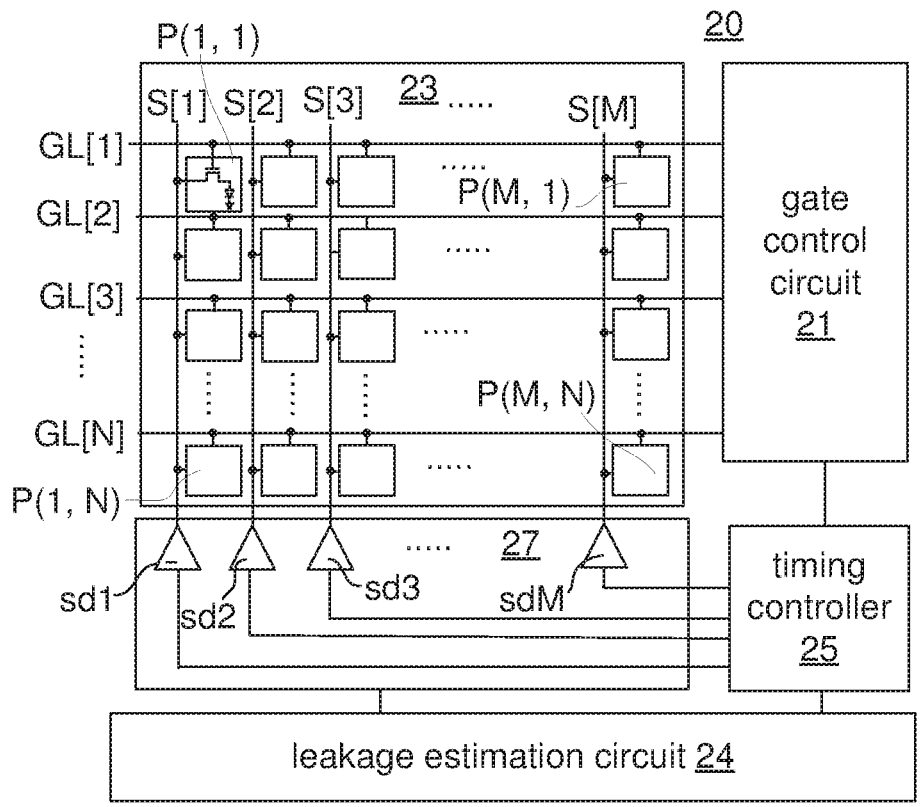
FIG. 3 is a schematic diagram illustrating a display device equipped with a leakage estimation circuit.

FIG. 3 is a schematic diagram illustrating a display device equipped with a leakage estimation circuit. The display device 20 includes a display panel 23, a gate control circuit 21, a timing controller 25, a source control circuit 27, and a leakage estimation circuit 24. The gate control circuit 21 and the leakage estimation circuit 24 are both electrically connected to the timing controller 25 and the display panel 23. The leakage estimation circuit 24 is electrically connected to the source drivers sd1, sd2, . . . sdM, and the timing controller 25.

The source control circuit 27 and the gate control circuit 21 receive timing control signals from the timing controller 25. The gate control circuit 21 is electrically connected to N gate lines GL[1]~GL[N]. The source control circuit 27 includes M source drivers sd1, sd2, . . . sdM, which are respectively electrically connected to M source lines S[1]~S[M]. In the display panel 23, pixels P(1, 1)~P(M, N) are arranged in M columns and N rows. M and N are positive integers. The pixels located at the same column are electrically connected to the same source line S[1]~S[M], and the pixels located at the same row are electrically connected to the same gate line GL[1]~GL[N].

According to the embodiment of the present disclosure, operation of the leakage estimation circuit 24 is related to the source control circuit 27 and the timing controller 25. In practical application, the leakage estimation circuit 24 and the source control circuit 27 can be integrated together or separate.

The timing controller 25 sends a mode control signal Smd to trigger the leakage estimation procedure being performed by the leakage estimation circuit 24. Then, the leakage estimation circuit 24 determines if there is abnormal leakage current. Existence of the abnormal leakage current implies that the display panel has a short circuit, and the display panel 23 is under the risk of burning out. In a cast that the short circuit exists, the leakage estimation circuit 24 can transmit a warning signal Swm to notify the timing controller 25. Later, the timing controller 24 may control the display panel 23 to display a warning message, or the timing controller 24 may directly shut down the display panel 23. Consequentially, the display panel 23 can be well protected from being burnt out because of the short circuit.

Figure 4:
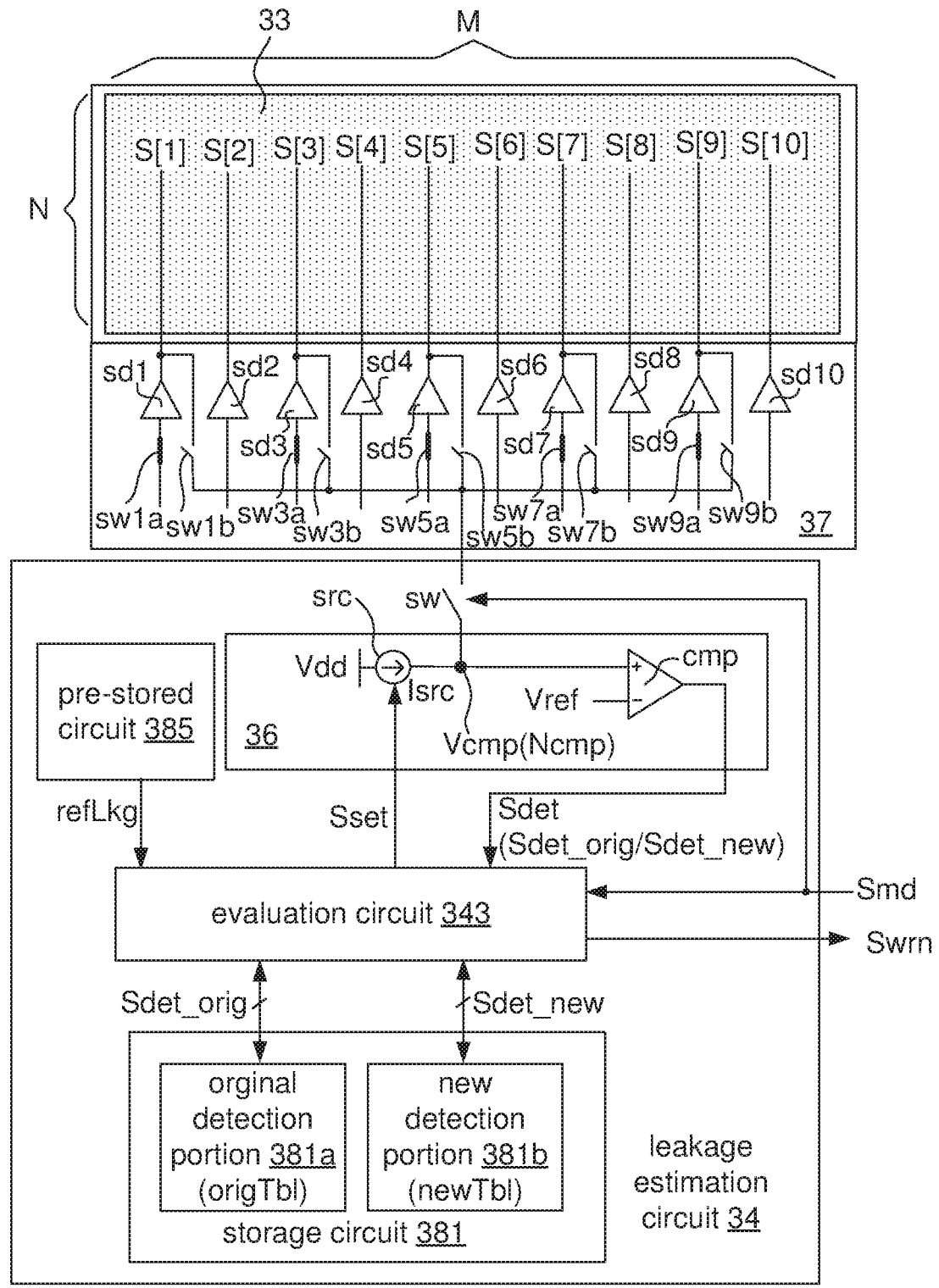
FIG. 4 is a schematic diagram illustrating internal components of the leakage estimation circuit.

FIG. 4 is a schematic diagram illustrating internal components of the leakage estimation circuit. For the sake of illustration, the display panel 33 is assumed to have 10 columns of pixels, though the pixels are not drawn. The source control circuit 37 provides data voltages to the display panel 33 through source lines S[1]~S[10].

The leakage estimation circuit 34 includes a mode-switch sw, a defect detection circuit 36, a pre-stored circuit 385, a storage circuit 381, and a leakage current evaluation circuit 343. The pre-stored circuit 385 is implemented with non-volatile memory devices, and storage circuit 381 is implemented with volatile/non-volatile memory devices.

In the pre-stored circuit 385, a reference leakage current refLkg is saved. The evaluation circuit 343 may acquire the reference leakage current refLkg during the leakage estimation procedure. The storage circuit 381 further includes an original detection portion 381a and a new detection portion 381b. The original detection portion 381a is used for storing an original comparison table origTbl, and the new detection portion is used for storing a new comparison table newTbl. Details about generation and usages of the original comparison table origTbl and the new comparison table newTbl will be illustrated below.

The mode-switch sw is electrically connected to the source control circuit 37 and the defect detection circuit 36. The defect detection circuit 36 further includes a current source src, a comparator cmp. The current source src is electrically connected to the evaluation circuit 343, a supply voltage Vdd and a comparison terminal Ncmp. The current source src provides a source current Isrc and the source current Isrc is adjustable by a current setting signal Sset. The current setting signal Sset represents different testing current values tstC used to set the source current Isrc. The comparator cmp is an operational amplifier having an inverting terminal (−), a non-inverting terminal (+), and an output terminal. The inverting terminal (−) receives a reference voltage Vref (for example, 0-18V), the non-inverting terminal (+) is electrically connected to the comparison terminal Ncmp, and the output terminal of the comparator cmp is electrically connected to the evaluation circuit 343. The output terminal of the comparator cmp generates a detected signal Sdet. The detected signal Sdet is transmitted to the evaluation circuit 343.

Depending on the comparison between the reference voltage Vref and the voltage at the comparison terminal (that is, the comparison voltage Vcmp, the state of the detected signal Sdet is determined. The reference voltage Vref is adjustable, depending on the precision requirement of the leakage estimation.

When the comparison voltage Vcmp is greater than the reference voltage Vref, the detected signal Sdet outputs a logic high level (state "1") to the evaluation circuit 343. When the comparison voltage Vcmp is less than or equivalent to the reference voltage Vref, the detected signal Sdet outputs a logic low level (state "0") to the evaluation circuit 343. In a case that the short circuit on the display panel 33 exists, the comparison voltage Vcmp is changed, and the detected signal Sdet might be affected as well. Therefore, the state of the detected signal Sdet can be referred by the evaluation circuit 343 to determine whether the display panel 33 is intact or cracked.

The evaluation circuit 343 is electrically connected to the defect detection circuit 36, the pre-stored circuit 385, the storage circuit 381, and the timing controller. The evaluation circuit 343 receives the mode control signal Smd from the timing controller and transmits a warning signal Swm to the timing controller if necessary.

In FIG. 4, all the source lines S[1]~S[10] are electrically connected to their corresponding source drivers sd1~sd10. On the other hand, the source lines S[1]~S[10] are alternatively electrically connected to the mode-switch sw. Depending on whether the source line S[1]~S[10] is electrically connected to the mode-switch sw or not, the source lines S[1]~S[10] can be classified into two groups. For example, a group includes the odd-numbered source lines S[1], S[3], S[5], S[7], S[9], and another group includes the even-numbered source lines S[2], S[4], S[6], S[8], S[10]. In practical application, the even-numbered source lines S[2], S[4], S[6], S[8], S[10] might be the ones being electrically connected to the mode-switch sw, not the odd-numbered source lines S[1], S[3], S[5], S[7], S[9].

In FIG. 4, the odd-numbered source lines S[1], S[3], S[5], S[7], S[9] are electrically connected to two types of switches, including the channel-switches sw1a, sw3a, sw5a, sw7a, sw9a, and detection-switches sw1b, sw3b, sw5b, sw7b, sw9b. The channel-switches sw1a, sw3a, sw5a, sw7a, sw9a are electrically connected to inputs of the source drivers sd1, sd3, sd5, sd7, sd9, and the timing controller. Relatively, the detection-switches sw1b, sw3b, sw5b, sw7b, sw9b are electrically connected to outputs of the source drivers sd1, sd3, sd5, sd7, sd9, and the mode-switch sw.

The display panel 33, according to the embodiment of the present disclosure, may operate in two modes, a normal display mode, and a leakage estimation mode. Depending on the operation mode of the display panel 33, switching statuses of the mode-switch sw, the channel-switches sw1a, sw3a, sw5a, sw7a, sw9a, and the detection-switches sw1b, sw3b, sw5b, sw7b, sw9b are different.

When the mode control signal Smd is set to a first logic state (for example, "0"), the display panel operates in the normal display mode. Meanwhile, the mode-switch sw is turned off, the channel-switches sw1a, sw3a, sw5a, sw7a, sw9a are turned on, and the detection-switches sw1b, sw3b, sw5b, sw7b are turned off. Alternatively speaking, the defect detection circuit 36 is disconnected to the source control circuit 37, and the source drivers sd1~sd10 respectively provide data voltages to source lines S[1]~S[10].

On the other hand, when the mode control signal Smd is set to a second logic state (for example, "1"), the display panel operates in the leakage estimation mode. Meanwhile, the mode-switch sw is turned on, the channel-switches sw1a, sw3a, sw5a, sw7a, sw9a are turned off, and the detection-switches sw1b, sw3b, sw5b, sw7b are turned on. Thus, the defect detection circuit 36 is capable of detecting the status of the source control circuit 37 through the mode-switch sw.

In practical application, the timing controller sets the display panel 33 to enter the leakage estimation mode when the screen is not displaying images. For example, soon after the display panel is just power on, or when the display panel is in a blank duration. The blank duration can be, for example, the horizontal synchronization duration (hereinafter, Hsync), or the vertical synchronization duration (hereinafter, Vsync).

Figure 5:
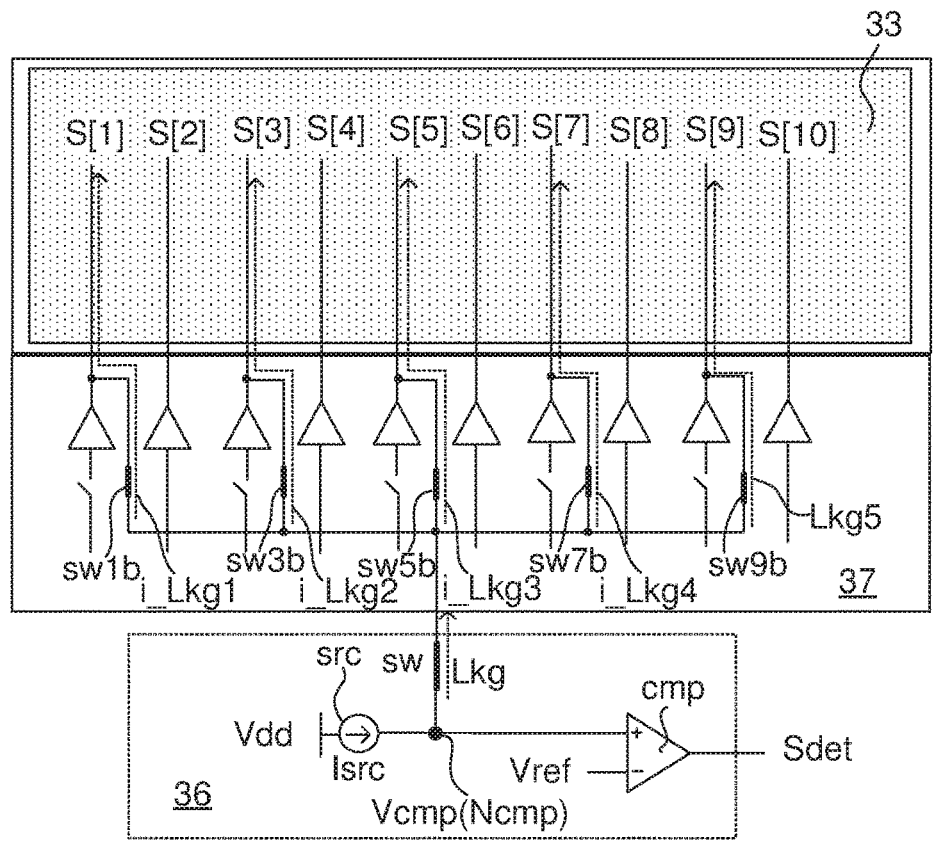
FIGS. 5 and 6 are schematic diagrams illustrating how the leakage currents of the intact display panel and the cracked display panel are estimated, respectively.
Figure 6:
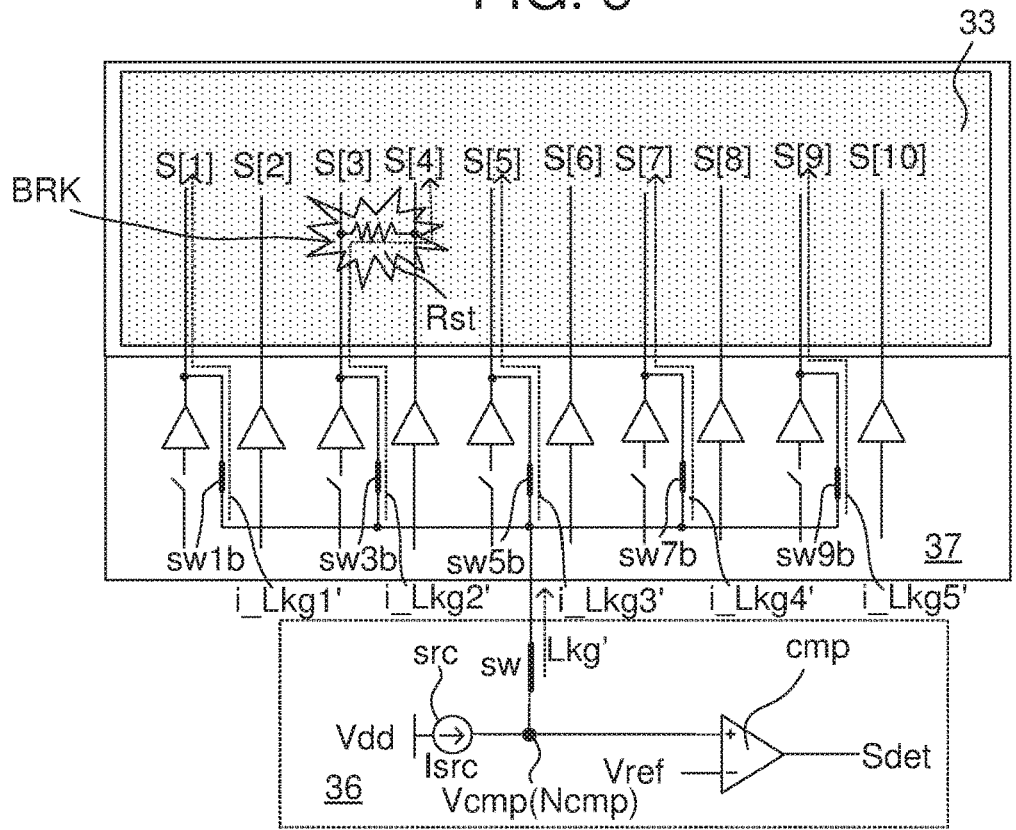

FIGS. 5 and 6 are schematic diagrams illustrating how the leakage currents of the intact display panel and the cracked display panel are estimated, respectively. In both figures, a leakage current i_Lkg, i_Lkg' flows from the comparison terminal Ncmp to the display panel 33 through the mode-switch sw and the detection-switches sw1b, sw3b, sw5b, sw7b, sw9b. When the display panel 33 remains intact, as shown in FIG. 5, the source lines S[3], S[4] are separate and independent. In FIG. 6, the break BRK causes a short circuit between the source lines S[3], S[4] so that the source lines S[3], S[4] are mutually influenced. The short circuit between the source lines S[3], S[4] can be considered as a shortage resistor Rst.

In FIG. 5, the leakage current i_Lkg flows to the source control circuit 37 and the display panel. The leakage current i_Lkg is divided into five branch currents Lkg1, Lkg2, Lkg3, Lkg4, Lkg5. When the display panel 33 is intact, the branch current Lkg1 flows to the source line S[1] through conduction of the detection-switch sw1b, the branch current Lkg2 flows to the source line S[2] through conduction of the detection-switch sw2b, the branch current Lkg3 flows to the source line S[3] through conduction of the detection-switch sw3b, the branch current Lkg4 flows to the source line S[4] through conduction of the detection-switch sw4b, and the branch current Lkg5 flows to the source line S[5] through conduction of the detection-switch sw5b.

Similarly, in FIG. 6, the leakage current i_Lkg' is divided into five branch currents Lkg1', Lkg2', Lkg3', Lkg4', Lkg5'. Although flowing paths of the branks currents Lkg1', Lkg3', Lkg4', Lkg5' are similar to their counterparts in FIG. 5, the flowing path of the branch current i_Lkg2' is different. The branch current i_Lkg2' is conducted from the source line S[3] to the source line S[4] because of the shortage resistor Rst. As the flowing path of the brank current i_Lkg2' has been changed, the current value of the brank current i_Lkg2', the current value of the leakage current i_Lkg', the comparison voltages Vcmp, and the comparison voltage Vcmp in FIG. 6 are all affected. Therefore, the detected signal Sdet can be utilized to indicate if there is a short circuit in the display panel.

Figures 7, 8A, 8B, 8C, 8D, 8E, 9, 10:
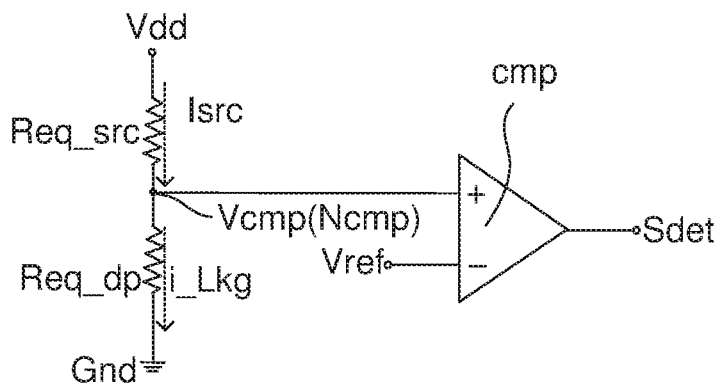
FIG. 7 is a schematic diagram illustrating generation of the detected signal Sdet and operation of the defect detection circuit.
FIGS. 8A~8E are schematic diagrams illustrating how the leakage current i_Lkg is estimated based on the states of the detected signal Sdet.
FIG. 9 is a schematic diagram illustrating that the original leakage current origLkg is estimated based on the original comparison table origTbl.
FIG. 10 is a schematic diagram illustrating that the new leakage current newLkg is estimated based on the new comparison table newTbl.

FIG. 7 is a schematic diagram illustrating generation of the detected signal Sdet and operation of the defect detection circuit. The panel equivalent resistor Req_dp is shown to represent the overall resistance value of the display panel, and the resistance of the panel equivalent resistor Req_dp is varied if the short circuit occurs. The panel equivalent resistor Req_dp is electrically connected to the comparison terminal Ncmp and a ground terminal Gnd.

When there is no break BRK on the display panel 33 (as shown FIG. 5), all the source lines remain separate, and resistance of the panel equivalent resistor Req_dp is equivalent to a default resistance value. On the other hand, when the break BRK exists (as shown in FIG. 6), the resistance of the panel equivalent resistor Req_dp is no longer equivalent to the default resistance value because of the shortage resistor Rst. Whenever there is short circuit, at least one of the branch currents is changed, so as the panel equivalent resistor Req_dp.

The current source src can be considered as a source equivalent resistor Rec_src being electrically connected to the supply voltage Vdd and the comparison terminal Ncm. The source current Isrc, as mentioned above, is set by the current setting signal Sset. In the present disclosure, the source current Isrc can be set to different testing current values tstC. The comparison voltage Vcmp is related to the source equivalent resistor Req_src, the panel equivalent resistor Req_dp, the supply voltage Vdd, the source current Isrc, and the leakage current i_Lkg.

In the present application, when the display panel is intact, the reference voltage Vref and comparison voltage Vcmp are designed to be equivalent. Whereas, when the leakage current i_Lkg changes, the comparison voltage Vcmp is affected, so as the state of the detected signal Sdet.

Therefore, the state of the detected signal Sdet can be utilized to recognize whether the leakage current i_Lkg is changed or not.

In order to maintain the equivalence between the comparison voltage Vcmp and the reference voltage Vref, the current value of the source current Isrc should be adjusted to be equivalent to the leakage current i_Lkg. In other words, the comparison voltage Vcmp can be equivalent to the reference voltage Vref again even if the leakage current i_Lkg is affected by the break on the display panel as long as the source current Isrc is equivalent to the leakage current i_Lkg. In other words, by setting the leakage current i_Lkg with different testing current values (tst1, tst2, and so forth), the current value of the leakage current i_Lkg can be estimated.

It is possible to increase the testing current values gradually so that the leakage current i_Lkg to be detected can be identified. For the sake of illustration, four different testing current values are respectively used to set the source current Isrc, and the testing current values are assumed to be in ascending order. That is, tst1<tst2<tst3<tst4. In response to the four different testing current values tst1, tst2, tst3, tst4, the states of the detected signal Sdet might have five possible combinations, as shown in FIGS. 8A~8E. FIGS. 8A~8E are schematic diagrams illustrating how the leakage current i_Lkg is estimated based on the states of the detected signal Sdet.

In FIG. 8A, the detected signal Sdet switches to state "1" when the source current Isrc is set to any of the testing current values tst1, tst2, tst3, tst4, and this implies that the leakage current i_Lkg is less than or equivalent to the testing current value tst1. That is, i_Lkg≤tst1. Alternatively speaking, the comparison voltage Vcmp becomes greater than the reference voltage Vref if the source current Isrc is greater than or equivalent to the testing current value tst1. Therefore, the leakage current i_Lkg is estimated as being equivalent to the testing current value tst1.

In FIG. 8B, the detected signal Sdet switches to state "0" when the source current Isrc is set to the testing current value tst1, and this implies that the leakage current i_Lkg is greater than the testing current value tst1. Moreover, the detected signal Sdet switches to state "1" when the source current Isrc is set to any of the testing current values tst2, tst3, tst4, and this implies that the leakage current i_Lkg is less than or equivalent to the testing current value tst2. That is, tst1<i_Lkg≤tst2. Alternatively speaking, the comparison voltage Vcmp becomes greater than the reference voltage Vref if the source current Isrc is set to a testing current value greater than or equivalent to the testing current value tst2. Therefore, the leakage current i_Lkg is estimated as being equivalent to the testing current value tst2.

In FIG. 8C, the detected signal Sdet switches to state "0" when the source current Isrc is set to any of the testing current values tst1, tst2. This implies that the leakage current i_Lkg is greater than the testing current value tst2. Moreover, the detected signal Sdet switches to state "1" when the source current Isrc is set to any of the testing current values tst3, tst4, and this implies that the leakage current i_Lkg is less than or equivalent to the testing current value tst3. That is, tst2<i_Lkg≤tst3. Alternatively speaking, the comparison voltage Vcmp becomes greater than the reference voltage Vref if the source current Isrc is set to a testing current value greater than or equivalent to the testing current value tst3. Therefore, the leakage current i_Lkg is estimated as being equivalent to the testing current value tst3.

In FIG. 8D, the detected signal Sdet switches to state "0" when the source current Isrc is set to any of the testing current values tst1, tst2, tst3. This implies that the leakage current i_Lkg is greater than the testing current value tst3. Moreover, the detected signal Sdet switches to state "1" when the source current Isrc is set to the testing current value tst4, and this implies that the leakage current i_Lkg is less than or equivalent to the testing current value tst4. That is, tst3<i_Lkg≤tst4. Alternatively speaking, the comparison voltage Vcmp becomes greater than the reference voltage Vref if the source current Isrc is set to a testing current value greater than or equivalent to the testing current value tst4. Therefore, the leakage current i_Lkg is estimated as being equivalent to the testing current value tst4.

In FIG. 8E, the detected signal Sdet switches to state "0" when the source current Isrc is set to any of the testing current values tst1, tst2, tst3, tst4. Alternatively speaking, the comparison voltage Vcmp is always less than the reference voltage Vref, even if the greatest testing current value tst4 has been set. Thus, it can be concluded that the leakage current i_Lkg to be estimated is greater than all of the testing current values tst1, tst2, tst3, ts4. That is, tst4<i_Lkg.

In the present disclosure, the leakage estimation procedure can be triggered in two occasions, soon after the display panel is just power-on and when the display panel continuously displays images. The estimated leakage currents are further compared and analyzed to determine when the display panel is cracked.

FIG. 9 is a schematic diagram illustrating that the original leakage current origLkg is estimated based on the original comparison table origTbl. In the leakage estimation procedure performed soon after the display panel is just power-on, the source current Isrc is respectively set to the testing current values tst1, tst2, tst3, tst4, and the original-detected signals Sdet_orig(tst1), Sdet_orig(tst2), Sdet_orig(tst3), Sdet_orig(tst4), are generated accordingly. The states of the original-detected signals Sdet_orig(tst1), Sdet_orig(tst2), Sdet_orig(tst3), Sdet_orig(tst4) listed in the original comparison table origTbl are then used for estimating the original leakage current origLkg, according to the previous descriptions in FIGS. 8A~8E.

FIG. 10 is a schematic diagram illustrating that the new leakage current newLkg is estimated based on the new comparison table newTbl. In the leakage estimation procedure performed during the leakage estimation procedure performed when the display panel continuously displays images, the source current Isrc is respectively set to the testing current values tst1, tst2, tst3, tst4, and the detected signals Sdet_new(tst1), Sdet_new(tst2), Sdet_new(tst3), Sdet_new(tst4), are generated. The states of the new-detected signals Sdet_new(tst1), Sdet_new(tst2), Sdet_new (tst3), Sdet_new(tst4) listed in the new comparison table newTbl are then used for estimating the new leakage current newLkg, according to the previous descriptions in FIGS. 8A~8E.

In practical application, the leakage estimation procedure can be repetitively performed, and the new comparison table newTbl can be updated while the display panel remains power-on and is continuously displaying images. Moreover, as illustrated above, the vertical synchronization duration Vsync and the horizontal synchronization duration Hsync are utilized to perform the leakage estimation procedure. As the vertical synchronization duration Vsync and the horizontal synchronization duration Hsync are relatively short, the new comparison table newTbl can be constructed in separate blank durations.

In the specification, the original comparison table origTbl represents the existing features of the display panel. Relatively, the new comparison table newTbl represents immediate features of the display panel. These immediate features do not exist when the display panel is just power-on but start to appear only after the display panel starts to display images. As the original comparison table origTbl and the new comparison newTbl can represent attributes of the display panel, they are referred by the evaluation circuit to identify whether and when the display panel is cracked by the external force.

Figure 11:
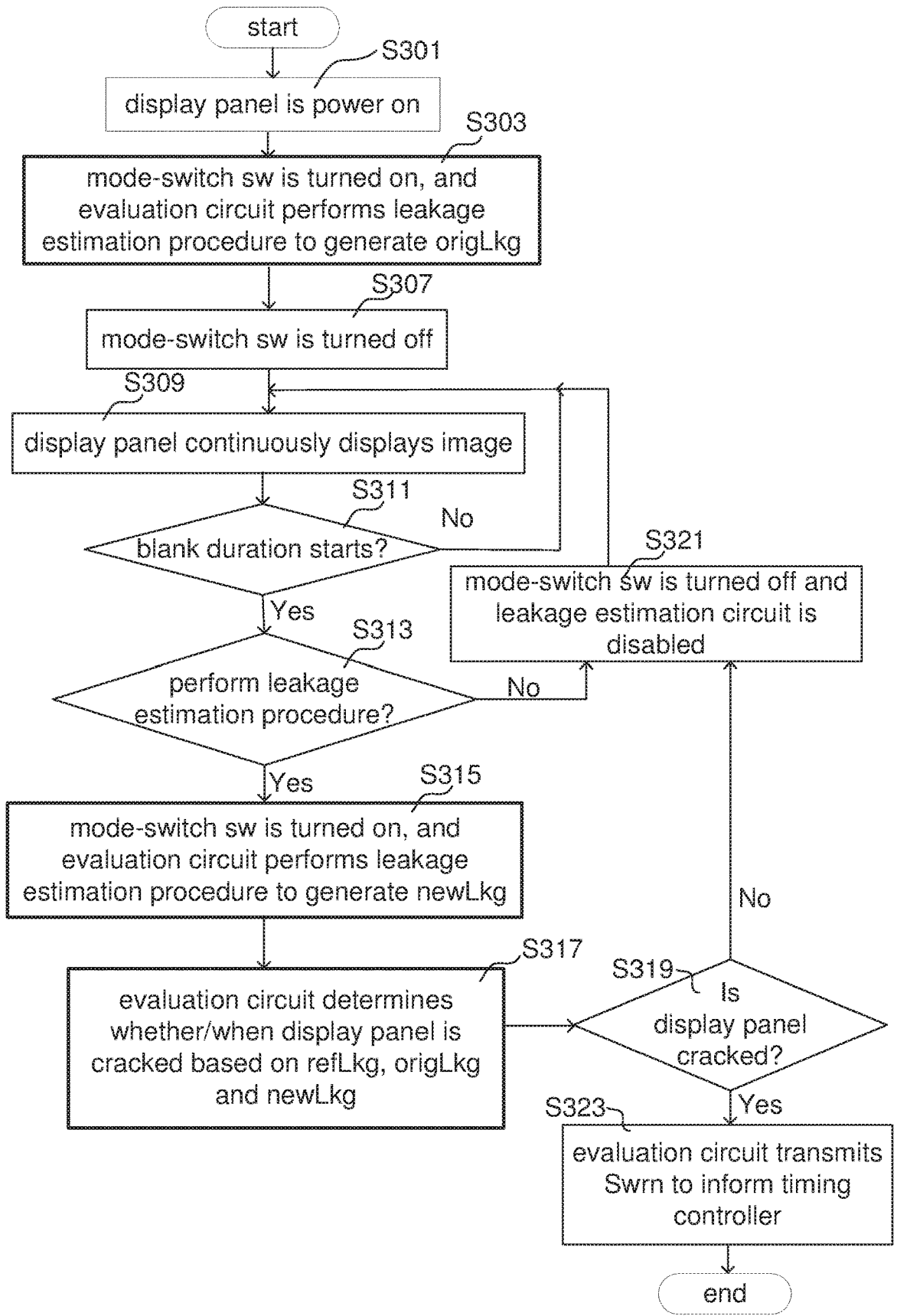
FIG. 11 is a flow diagram illustrating how the display panel is determined to have a short circuit or not.

FIG. 11 is a flow diagram illustrating how the display panel is determined to have a short circuit or not. Firstly, as soon as the display panel is power-on (step S301), the mode-switch sw is turned on, and the evaluation circuit is triggered to perform the leakage estimation procedure (step S303). In the leakage estimation procedure, the defect detection circuit generates the original-detected signals Sdet_orig(tst1)~Sdet_orig(tst4) to construct the original comparison table origTbl. Then, the original comparison table origTbl is referred by the evaluation circuit to estimate the original leakage current origLkg. After the original leakage current origLkg is estimated, the mode-switch sw is turned off (step S307), and the display panel starts to continuously display images (step S309). In practical application, it is possible that the original comparison table origTbl is constructed at this stage but referred to estimate the original leakage current origLkg later.

The timing controller determines if any of the blank durations (such as Vsync, Hsync) starts (step S311). If not, step S309 is performed repeatedly. If the blank duration starts, the timing controller further determines if the leakage estimation procedure should be performed (step S313). If the determination result of step S313 is negative, the mode-switch sw is turned off, and the leakage estimation circuit is disabled (step S321). Then, step S309 is executed again.

If the determination result of step S313 is positive, the timing controller sends the mode control signal Smd to the leakage estimation circuit 34 so that the mode-switch sw is turned on and the evaluation circuit starts to perform the leakage estimation procedure. In the leakage estimation procedure, the defect detection circuit generates the new-detected signals Sdet_new(tst1)~Sdet_new(tst4) to construct the new comparison table newTbl. Then, the new comparison table newTbl is referred by the evaluation circuit to estimate the new leakage current newLkg (step S315). Later, the evaluation circuit determines whether the display panel is cracked based on comparisons between the reference leakage current refLkg, the original leakage current origLkg, and the new leakage current newLkg (step S317). Details and variations about step S317 are illustrated in FIG. 12.

The reference leakage current refLkg represents a baseline current value of the leakage current corresponding to the display panel, and its origin should not be limited. The reference leakage current refLkg can be provided by the manufacturer of the display device. Alternatively, the reference leakage current refLkg can be the leakage current being estimated previously when the display panel was power-on before, and the reference leakage refLkg is pre-stored at the pre-stored circuit 385. Or, the reference leakage refLkg can also be obtained by choosing the minimum among the original leakage currents origLkg corresponding to the panel-partitions.

Based on the comparison results between the reference leakage current refLkg, the original leakage current origLkg, and the new leakage current newLkg, the evaluation circuit may determine whether the display panel is cracked or not (step S319). If the display panel is not cracked, step S321 is executed. If the display panel is cracked, the evaluation circuit transmits the warning signal Swm to the timing controller. Later, the timing controller may turn off the display panel to prevent the display panel from being burnt-out.

Figure 12:
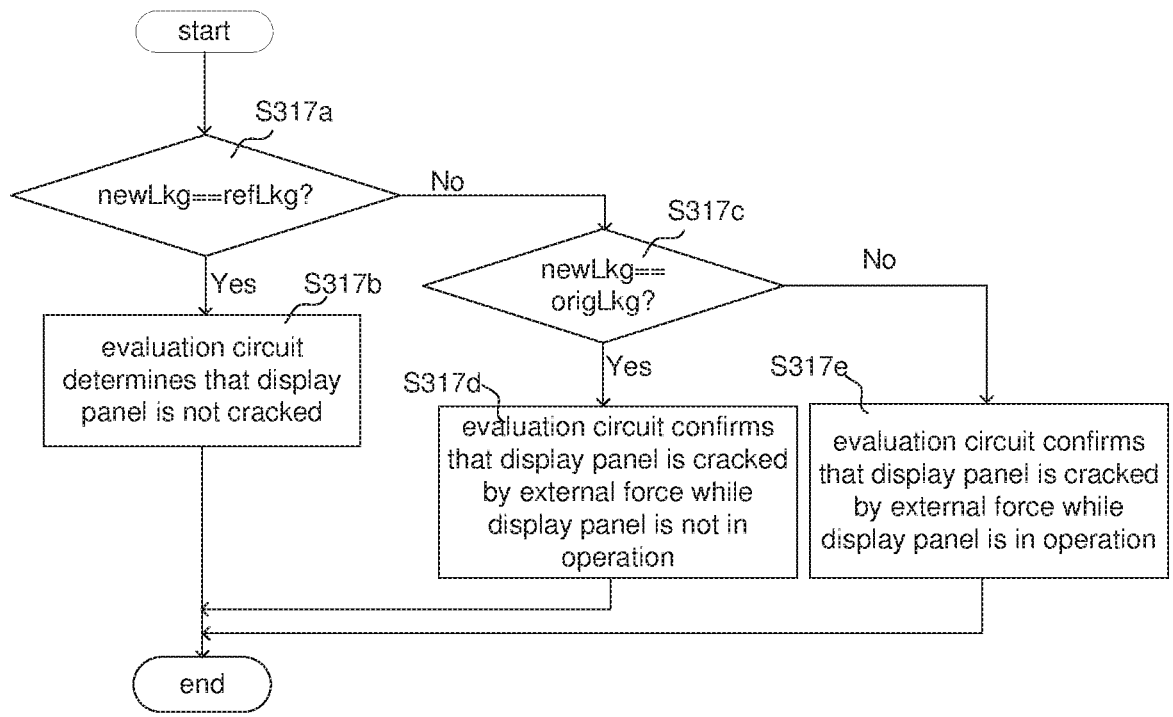
FIG. 12 is a flow diagram illustrating whether and when the display panel is cracked.

FIG. 12 is a flow diagram illustrating whether and when the display panel is cracked. The evaluation circuit firstly compares the new leakage current newLkg and the reference leakage current refLkg (step S317a). If the new leakage current newLkg and the reference leakage current refLkg are equivalent, the evaluation circuit determines that the display panel is not cracked (step S317b). If the new leakage current newLkg and the reference leakage current refLkg are different, the evaluation circuit determines that the new leakage current newLkg is abnormal. Then, the equivalence or inequivalence between the new leakage current newLkg and the original leakage current origLkg is determined to find out when the display panel is cracked (step S317c).

If the determination result of step S317c is positive, the evaluation circuit recognizes that original leakage current origLkg is also abnormal. Thus, the evaluation circuit further determines that the abnormal phenomenon should have already existed as soon as the display panel is power-on. In other words, the evaluation circuit confirms that the display panel is cracked while the display panel was power-off/not in operation (step S317d).

If the determination result of step S317c is negative, the evaluation circuit recognizes that the abnormal phenomenon does not exist when the display panel is just power-on but starts to exist after the display panel starts to display images. Therefore, the evaluation circuit confirms that the display panel is cracked while the display panel is power-on/in operation (step S317e).

In practical application, the display panel can be divided into J panel-partitions, and the defect detection circuit might estimate the leakage currents corresponding to these panel-partitions separately. J is a positive integer. In consequence, the position of the break BRK can be identified. An example showing that the display panel is divided into four panel-partitions (that is, J=4) is illustrated below.

Figure 13:
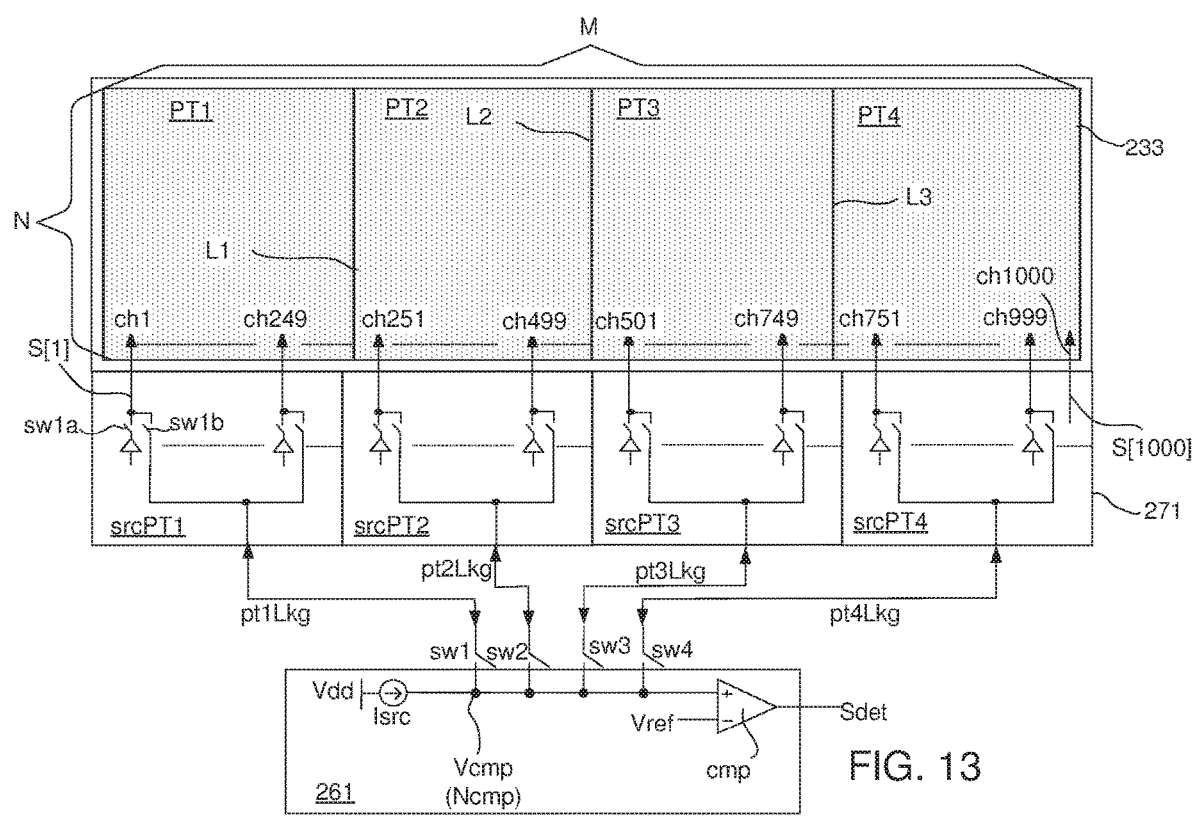
FIG. 13 is a schematic diagram illustrating that the leakage estimation procedure is performed to four panel-partitions defined on the display panel.

FIG. 13 is a schematic diagram illustrating that the leakage estimation procedure is performed to four panel-partitions defined on the display panel. The display panel 233 includes 1000 channels which are classified into four panel-partitions PT1, PT2, PT3, PT4. The boundary line L1 separates channels in the panel-partition PT1 and the panel-partition PT2, the boundary line L2 separates channels in the panel-partition PT2 and the panel-partition PT3, and the boundary line L3 separates channels in the panel-partition PT3 and the panel-partition PT4. That is, each of the boundary lines L1, L2, L3 can be considered as a boundary of two adjacent panel-partitions. The boundary lines L1, L2, L3 are drawn to assist illustration, and they might not be physically labeled on the display panel.

In FIG. 13, the source lines S[1]~S[1000] receive data voltages from the source drivers, respectively. The even-numbered source drivers and source lines are not shown to simplify the complexity. The source drivers in the source control circuit 271 are divided into four source-control partitions srcPT1, srcPT2, srcPT3, srcPT4. The layout of the panel-partitions and their relative connections are summarized in Table 1.

TABLE 1

| panel-partition | | PT1 | PT2 | PT3 | PT4 |
|---|---|---|---|---|---|
| source lines (channel) | | ch1~ ch250 | ch251~ ch500 | ch501~ ch750 | ch751~ ch1000 |
| source-control partition connections of source driver | odd-numbered channels | srcPT1 timing controller and mode-switch sw1 | srcPT2 timing controller and mode-switch sw2 | srcPT3 timing controller and mode-switch sw3 | srcPT4 timing controller and mode-switch sw4 |
| | even-numbered channels | timing controller | | | |

All the 1000 source drivers are electrically connected to the timing controller, and each of the source-control partition srcPT1, srcPT2, srcPT3, srcPT4 includes 250 source drivers (M/J=1000/4=250). In addition to the timing controller, the odd-numbered source drivers located at the source-control partition srcPT1 (source drivers corresponding to channels ch1, ch3, . . . ch249) are electrically connected to the mode-switch sw1. Alternatively speaking, half out of the 250 source drivers in source-control partition srcPT1 are electrically connected to the mode-switch sw1. The source drivers located at the source-control partitions srcPT2, srcPT3, srcPT4 have similar connections, so they are not illustrated.

When the display panel operates in the normal display mode, the mode-switches sw1, sw2, sw3, sw4 are all turned off. When the display panel operates in the leakage estimation mode, one of the mode-switches sw1, sw2, sw3, sw4 is turned on each time, depending on which of the panel-partitions PT1, PT2, PT3, PT4 is selected for leakage estimation. When the panel-partition PT1 is selected for leakage estimation, the mode-switch sw1 is turned on, and the mode-switches sw2, sw3, sw4 are turned off. Meanwhile, the detection-switches sw1$b$ corresponding to the odd-numbered channels (ch1, ch3, . . . ch249) in the source-control partition srcPT1 are turned on. The similar control mechanism can be applied to the panel-partitions PT2, PT3, PT4. In a case that more panel-partitions are defined on the display panel, sizes of the original comparison table origTbl and the new comparison table newTbl expand accordingly.

In practical application, the defect detection circuit 261 might include multiple sets of the mode-switches, the current sources, and the comparators so that the leakage estimation procedure can be performed in a parallel manner. For example, each of the panel-partitions PT1, PT2, PT3, PT4 is corresponding to a specific mode-switch, a specific current source, and a specific comparator.

For the sake of illustration, for the original comparison table origTbl and the new comparison table newTbl involving different panel-partitions and different testing current values, the parameter "pt" is used to represent the panel-partition, and the parameter "tstC" is used to represent the testing current value being set to the source current Isrc. Moreover, the coordinate (pt, tstC) is used to indicate the attributes related to the detected signal Sdet. Once all the panel-partitions have been selected for the leakage estimation procedures when the screen continuously displays images, an original comparison table origTbl showing different original-detected signals Sdet_orig(pt, tstC) similar to FIG. 14 and a new comparison table newTbl showing different new-detected signals Sdet_new(pt, tstC) similar to FIG. 15 are generated.

Figure 14:
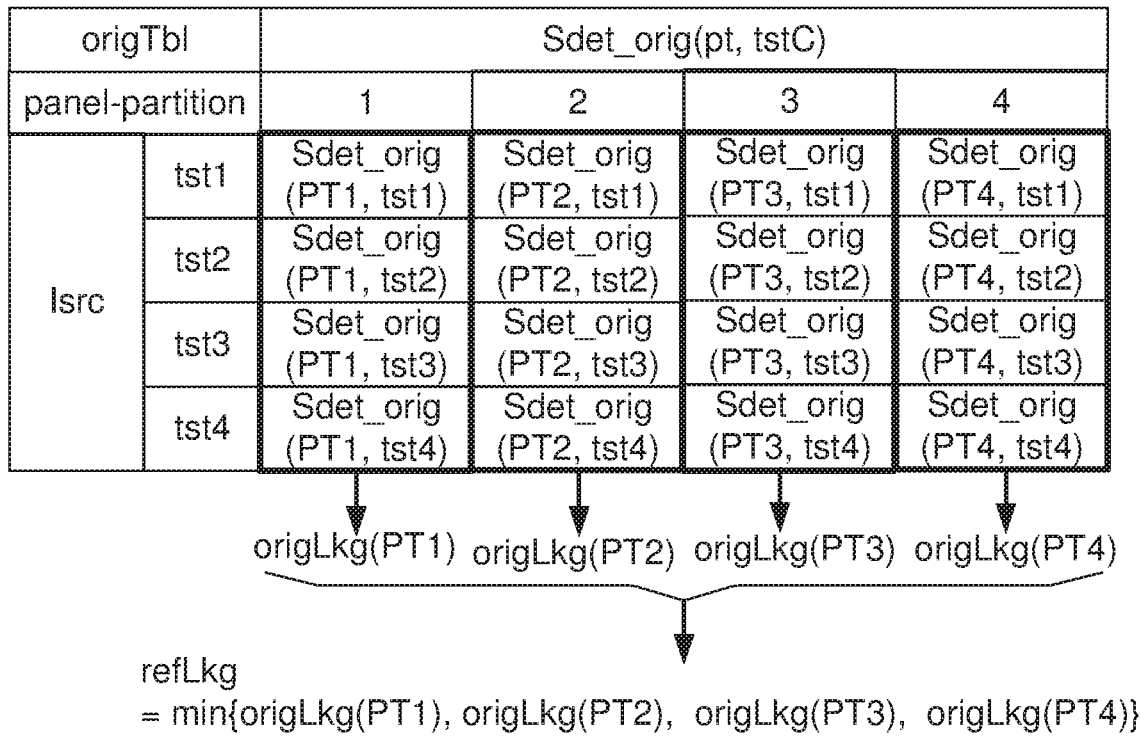
FIG. 14 is a schematic diagram illustrating that the states of the detected signals Sdet summarized in the original comparison table are utilized to estimate the original leakage currents origLkg respectively corresponding to different panel-partitions are estimated.

FIG. 14 is a schematic diagram illustrating that the states of the detected signals summarized in the original comparison table are utilized to estimate the original leakage currents origLkg respectively corresponding to different panel-partitions are estimated. The original comparison table origTbl in FIG. 14 includes four sets of original-detected signals Sdet_orig(pt, tstC) and each of which is shown with a bold rectangle.

Basically, the original leakage current corresponding to the panel-partition PT1 origLkg(PT1) is jointly determined by the original-detected signals Sdet_orig(PT1, tst1), Sdet_orig(PT1, tst2), Sdet_orig(PT1, tst3), Sdet_orig(PT1, tst4). The original-detected signals Sdet_orig(PT1, tst1), Sdet_orig(PT1, tst2), Sdet_orig(PT1, tst3), Sdet_orig(PT1, tst4) are respectively obtained by applying different testing current values tst1, tst2, tst3, tst4 to estimate the original leakage current corresponding to the panel-partition PT1 origLkg(PT1) when the display panel is just power on. Similarly, the original leakage currents origLkg(PT2), origLkg(PT3), origLkg(PT4) can be respectively estimated. Moreover, based on comparisons between the original leakage currents origLkg(PT1), origLkg(PT2), origLkg(PT3), orgLkg(PT4), the reference leakage current refLkg can be determined.

Figure 15:
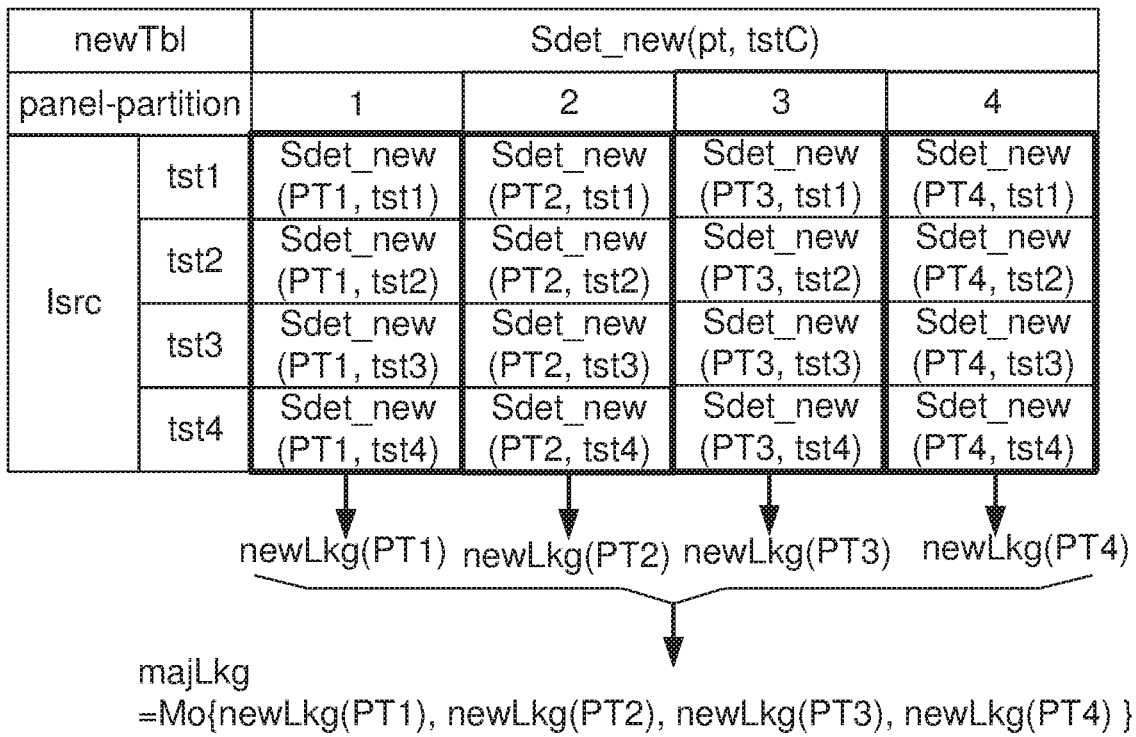
FIG. 15 is a schematic diagram illustrating that the states of the detected signals Sdet summarized in the new comparison table are utilized to estimate the new leakage currents newLkg respectively corresponding to different panel-partitions are estimated.

FIG. 15 is a schematic diagram illustrating that the states of the detected signals summarized in the new comparison table are utilized to estimate the new leakage currents newLkg respectively corresponding to different panel-partitions are estimated. The new leakage current corresponding to the panel-partition PT1 newLkg(PT1) is determined according to the new-detected signals Sdet_new(PT1, tst1)~Sdet_new(PT1, tst4). The new-detected signals Sdet_new(PT1, tst1), Sdet_new(PT1, tst2), Sdet_new(PT1, tst3), Sdet_new(PT1, tst4) are respectively obtained by applying different testing current values tst1, tst2, tst3, tst4 to estimate the new leakage current corresponding to the panel-partition PT1 newLkg(PT1) when the display panel remains in operation. Similarly, the new leakage currents newLkg(PT2), newLkg(PT3), newLkg(PT4) can be estimated, respectively.

Furthermore, in the specification, a majority leakage current majLkg can be defined. The majority leakage current majLkg is the mode of the new leakage currents newLkg(PT1), newLkg(PT2), newLkg(PT3), newLkg(PT4). The majority leakage current majLkg is greater than or equivalent to the reference leakage current refLkg.

Figure 16:
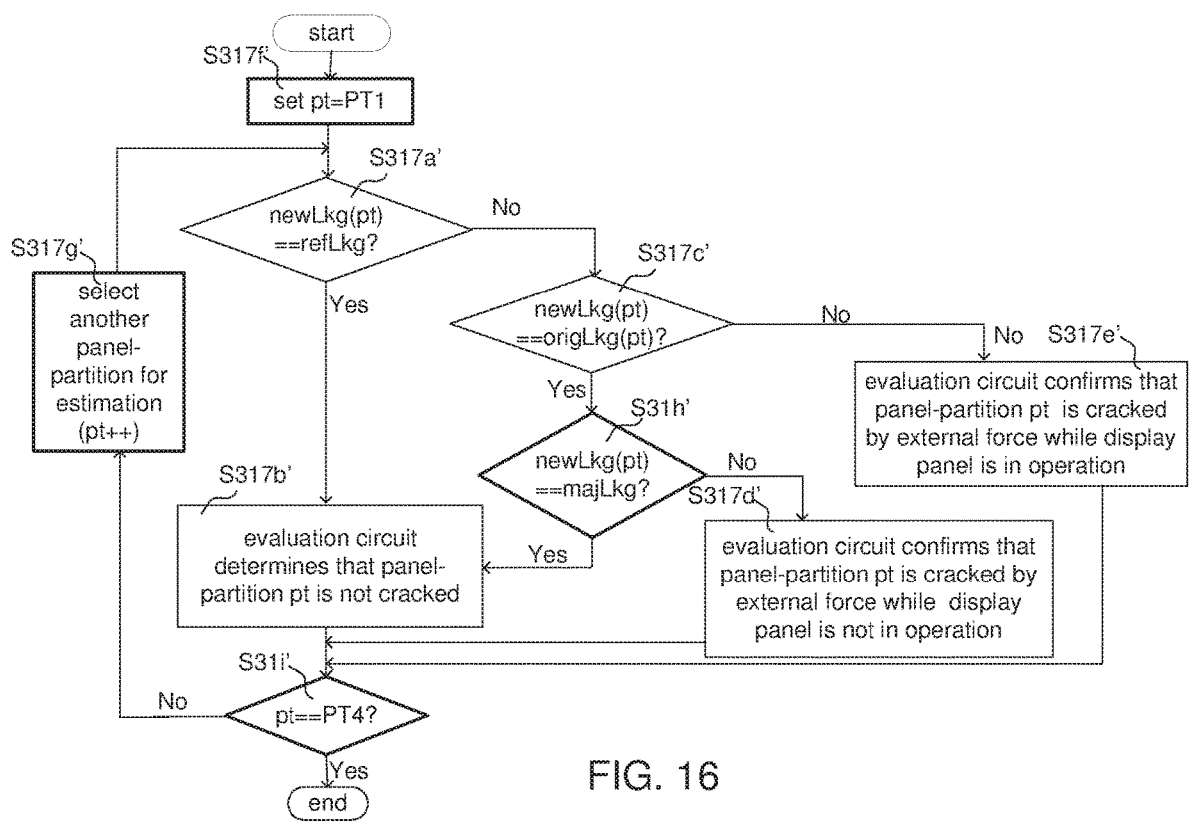
FIG. 16 is a flow diagram illustrating whether and when the panel-partition is cracked.

FIG. 16 is a flow diagram illustrating whether and when the panel-partition is cracked. In short, the steps in FIG. 16 are mainly modified from steps in FIG. 12. For example, steps S317$a'$~S317$e'$ are similar to steps S317$a$~S317$e$. In FIG. 16, steps S317$f'$~S317$i'$ are shown in bold frames to represent that some modifications are needed when the display panel is divided into multiple panel-partitions.

Figure 17:
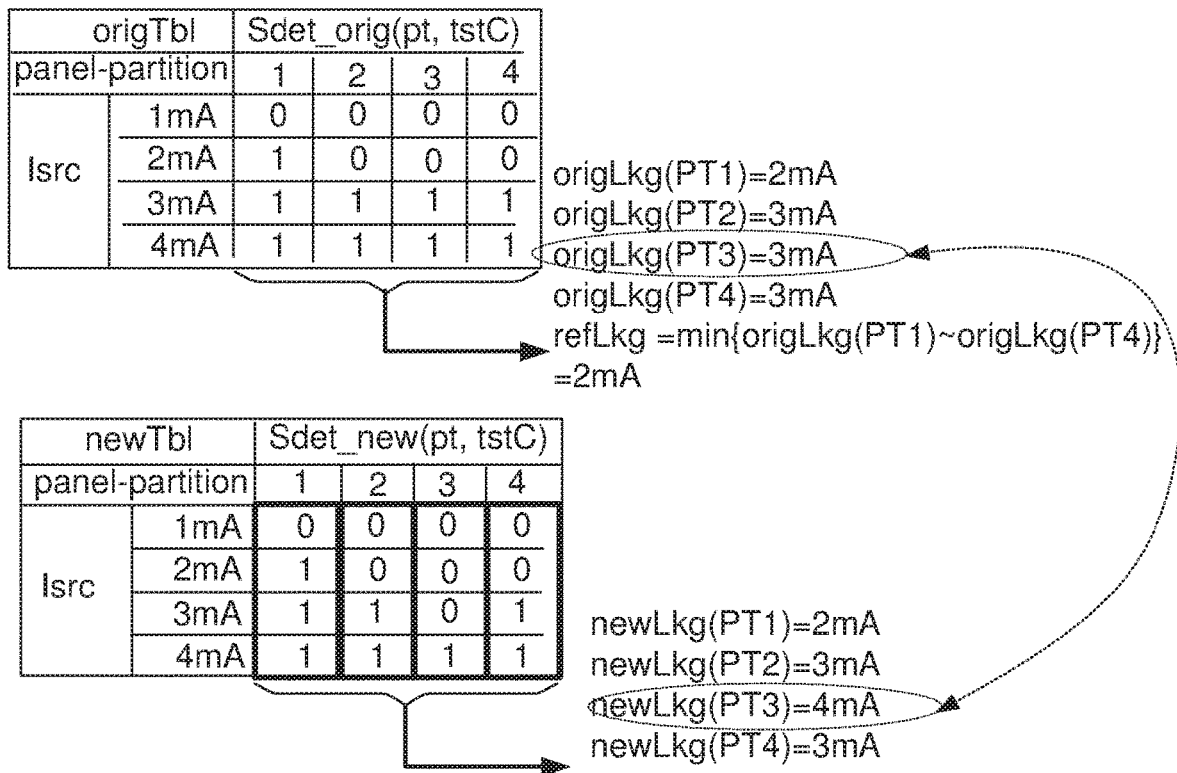
FIG. 17 is a schematic diagram illustrating a scenario in which the evaluation circuit determines that the display panel is cracked by the external force while the display panel is in operation.

FIG. 17 is a schematic diagram illustrating a scenario in which the evaluation circuit determines that the display panel is cracked by the external force while the display panel is in operation. Estimations of the original leakage currents origLkg(PT1)~origLkg(PT4) and the new leakage currents newLkg(PT1)~PT(4) in FIG. 17 are analog to the previous descriptions in FIGS. 8A~8E.

According to the original comparison table origTbl, the estimated original leakage current origLkg(PT1) is 2 mA, and the estimated original leakage currents origLkg(PT2), origLkg(PT3), origLkg(PT4) are 3 mA. In FIG. 17, the reference leakage current refLkg is assumed to be the minimum of the original leakage currents origLkg(PT1), origLkg(PT2), origLkg(PT3), origLkg(PT4), that is, 2 mA. On the other hand, according to the new comparison table newTbl, the estimated new leakage current newLkg(PT1) is 2 mA, the estimated new leakage currents newLkg(PT2), newLkg(PT3) are 3 mA, and the estimated new leakage current newLkg(PT3) is 4 mA. By definition, the majority leakage current majLkg is 3 mA.

After the original leakage currents origLkg(PT1)~origLkg(PT4), and the new leakage currents newLkg(PT1)~newLkg(PT4) are estimated, they are respectively compared in pairs. Please refer to FIGS. 16 and 17 together. As the steps in FIG. 16 are repetitively performed to different panel-partitions, the discussion below starts with step S317a' for each panel-partition.

For the panel-partition PT1, the reference leakage refLkg (2 mA) and the new leakage current newLkg(PT1) (2 mA) are equivalent to each other. Thus, the determination result of step S317a' is positive, and the evaluation circuit determines that the panel-partition PT1 is not cracked (step S317b').

For the panel-partition PT2, the reference leakage refLkg (2 mA) and the new leakage current newLkg(PT2) (3 mA) are not equivalent (determination result of step S317a' is negative). Thus, step S317c' is executed. As the new leakage current newLkg(PT2) (3 mA) and the original leakage current orgLkg(PT2) (3 mA) are equivalent, step S317h' is executed. In step S317h', the new leakage current newLkg(PT2) is further compared with the majority leakage current majLkg (3 mA). As the new leakage current newLkg(PT2) is equivalent to the majority leakage current majLkg (3 mA), the determination result of step S317h' is positive, and the evaluation circuit determines that the panel-partition PT2 is not cracked (step S317b').

For the panel-partition PT3, the reference leakage refLkg (2 mA) and the new leakage current newLkg(PT3) (3 mA) are not equivalent (determination result of step S317a' is negative). Then, the new leakage current newLkg(PT4) is further compared with the majority leakage current majLkg (3 mA). Thus, step S317c' is executed. As the new leakage current newLkg(PT4) (4 mA) and the original leakage current origLkg(PT4) (3 mA) are not equivalent, the evaluation circuit determines that the panel-partition PT3 is cracked by the external force while the display panel is in operation (step S317e').

For the panel-partition PT4, the reference leakage refLkg (2 mA) and the new leakage current newLkg(PT4) (3 mA) are not equivalent (determination result of step S317a' is negative). Thus, step S317c' is executed. As the new leakage current newLkg(PT4) (3 mA) and the original leakage current orgLkg(PT4) (3 mA) are equivalent, step S317h' is executed. In step S317h', the new leakage current newLkg(PT4) is further compared with the majority leakage current majLkg (3 mA). As the new leakage current newLkg(PT4) is equivalent to the majority leakage current majLkg (3 mA), the determination result of step S317h' is positive, and the evaluation circuit determines that the panel-partition PT4 is not cracked (step S317b').

Figure 18:
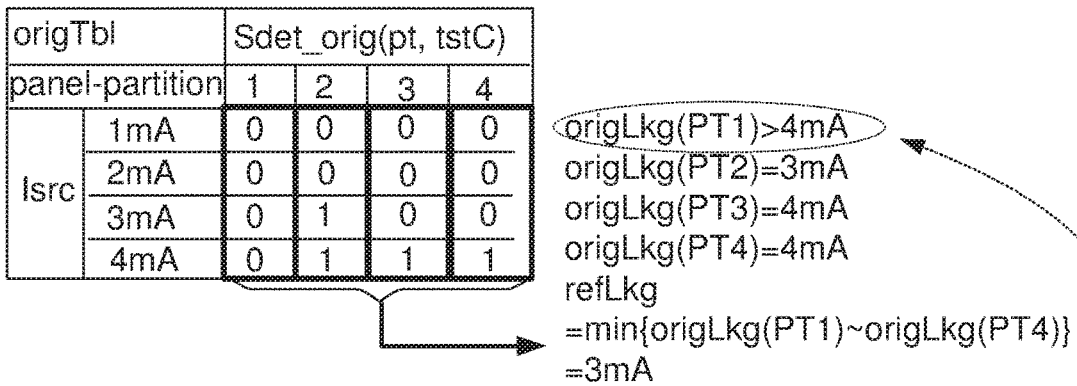
FIG. 18 is a schematic diagram illustrating a scenario in which the evaluation circuit determines that the display panel is cracked while the display panel is not in operation.
Figure 18:
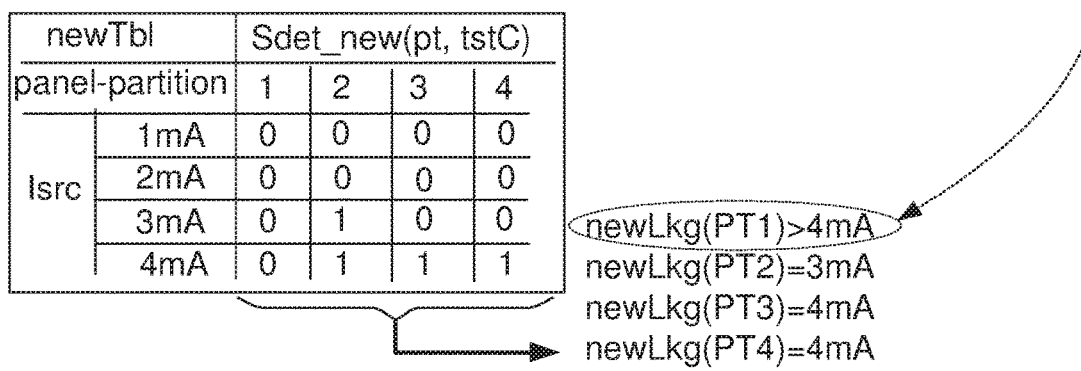

FIG. 18 is a schematic diagram illustrating a scenario in which the evaluation circuit determines that the display panel is cracked while the display panel is not in operation. Estimations of the original leakage currents origLkg(PT1) ~origLkg(PT4) and the new leakage current currents newLkg(PT1)~newLkg(PT4) in FIG. 17 are analog to the previous descriptions in FIGS. 8A~8E.

According to the original comparison table origTbl, the estimated original leakage current origLkg origLkg(PT1) is greater than 4 mA (but the actual value is still unknown unless greater testing current values tstC>4 are tested). The estimated original leakage currents origLkg(PT2), origLkg(PT3), origLkg(PT4) are 3 mA, 4 mA, 4 mA, respectively. In FIG. 18, the reference leakage current refLkg is 3 mA. According to the new comparison table newTbl, the estimated new leakage current newLkg(PT1) is greater than 4 mA (but the actual value is still unknown unless greater testing current values tstC>4 are tested), the estimated new leakage current newLkg(PT2) is 3 mA, and the estimated new leakage currents newLkg(PT3), newLkg(PT4) are 4 mA. By definition, the majority leakage current majLkg is 4 mA.

After the original leakage currents origLkg(PT1)~origLkg(PT4), and the new leakage currents newLkg(PT1)~newLkg(PT4) are estimated, they are respectively compared in pairs. Please refer to FIGS. 16 and 18 together. As the steps in FIG. 16 are repetitively performed to different panel-partitions, the following discussion starts from step S317a' for each panel-partition.

For the panel-partition PT1, the reference leakage refLkg (3 mA) and the new leakage current newLkg(PT1) (>4 mA) are not equivalent. Thus, the determination result of step S317a' is negative, and the evaluation circuit further compares the new leakage current newLkg(PT1) (>4 mA) with the original leakage current origLkg(PT1) (>4 mA) (step S317c'). The determination result of step S317c' is positive, and the new leakage current newLkg(PT1) (>4 mA) is further compared with the majority leakage current majLkg (4 mA) (step S317h'). As the determination result of step S317h' is negative, the evaluation circuit determines that the panel-partition PT4 is cracked by the external force while the display panel is not in operation (step S317d').

For the panel-partition PT2, the reference leakage refLkg (3 mA) and the new leakage current newLkg(PT2) (3 mA) are equivalent. Thus, the evaluation circuit determines that the panel-partition PT1 is not cracked (step S317b').

For the panel-partition PT3, the reference leakage refLkg (3 mA) and the new leakage current newLkg(PT3) (4 mA) are not equivalent. The new leakage current newLkg(PT3) (4 mA) is compared with the original leakage current origLkg(PT3) (4 mA) (step S317c'). As the determination result of step S317c' is positive, the new leakage current newLkg(PT3) (4 mA) is further compared with the majority leakage current (4 mA) (step S317h'). The determination result of step S317h' is positive, and the evaluation circuit determines that the panel-partition PT3 is not cracked (step S317b').

For the panel-partition PT4, the reference leakage refLkg (3 mA) and the new leakage current newLkg(PT4) (4 mA) are not equivalent. Thus, step S317c' is executed to compare the new leakage current newLkg(PT4) (4 mA) with the original leakage current origLkg(PT4) (4 mA). As the determination result of step S317c' is positive, the new leakage current newLkg(PT4) (4 mA) is further compared with the majority leakage current (4 mA) (step S317h'). As the determination result of step S317h' is positive, the evaluation circuit determines that the panel-partition PT4 is not cracked (step S317b').

Figures 19, 20:
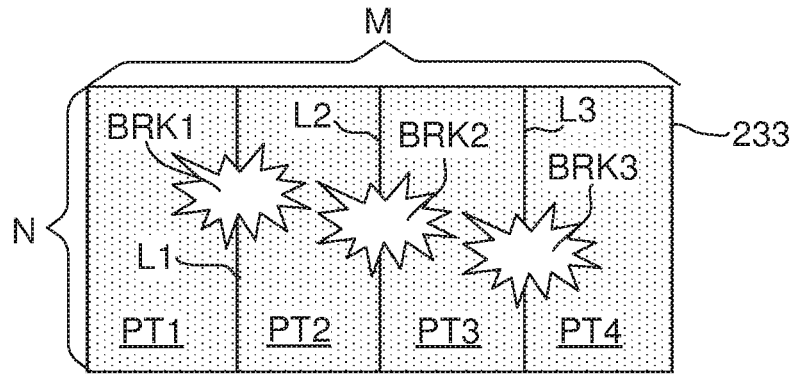
FIG. 19 is a schematic diagram illustrating that the leakage estimation circuit might not recognize the leakage currents if the breaks are located at boundaries of the panel-partitions.
FIG. 20 is a schematic diagram illustrating the original comparison table origTbl and the new comparison table newTbl corresponding to FIG. 19.

FIG. 19 is a schematic diagram illustrating that the leakage estimation circuit might not recognize the leakage currents if the breaks are located at boundaries of the panel-partitions. Similar to FIG. 13, four panel-partitions PT1, PT2, PT3, PT4 are defined on the display panel 233. In addition, three breaks BRK1, BRK2, BRK3 are shown. The break BRK1 is located at the boundary line L1 between the panel-partition PT1 and the panel-partition PT2, the break BRK2 is located at the boundary line L2 between the panel-partition PT2 and the panel-partition PT3, and the break BRK3 is located at the boundary line L3 between the panel-partition PT3 and the panel-partition PT4.

FIG. 20 is a schematic diagram illustrating the original comparison table origTbl and the new comparison table newTbl corresponding to FIG. 19. Based on the original comparison table origTbl, the original leakage currents origLkg(PT1), origLkg(PT2), origLkg(PT3), origLkg(PT4) are all greater than 4 mA, so the reference leakage current refLkg is not available. Based on the new comparison table newTbl, the new leakage currents newLkg(PT1), newLkg(PT2), newLkg(PT3), newLkg(PT4) are all greater than 4 mA, and the majority leakage current majLkg is not available. Therefore, the original comparison table origTbl and the new comparison table newTbl cannot provide useful information to the evaluation circuit.

Figures 21, 22:
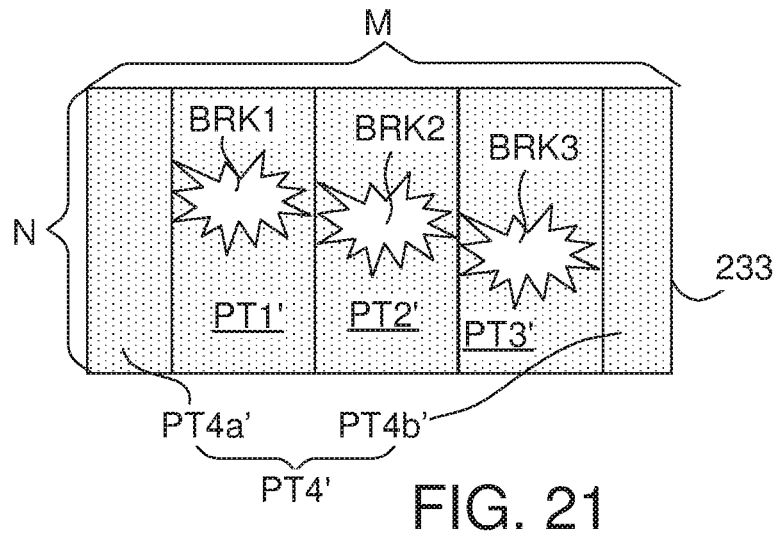
FIG. 21 is a schematic diagram illustrating that ranges of the four panel-partitions are shifted when an alternative partition configuration is adapted.
FIG. 22 is a schematic diagram illustrating the original comparison table origTbl and the new comparison table newTbl corresponding to FIG. 21.

FIGS. 20 and 21 collectively show that the evaluation circuit is incapable of estimating the leakage current in some cases when the partition configuration having panel-partitions PT1, PT2, PT3, PT4 with equal sizes and without coordinate shift is adopted. To reduce the chance of failure, a different partition configuration adapting coordinate shift is shown in FIG. 21.

FIG. 21 is a schematic diagram illustrating that ranges of the four panel-partitions are shifted when an alternative partition configuration is adapted. Four panel-partitions PT1', PT2', PT3', PT4' are defined on the display panel. The panel-partition PT4' further includes two sub-partitions PT4a', PT4b'. The positions of the breaks BRK1, BRK2, BRK3 in FIG. 21 are identical to the ones in FIG. 19, but the physical area of the panel-partitions being defined in FIGS. 19 and 21 are different.

As the left boundary of the panel-partition PT1' is not corresponding to the left edge of the display panel, such a partition configuration is defined as the partition configuration with the coordinate shift. Because of the coordinate shift, the break BRK1 is now located at the panel-partition PT1', the break BRK2 is now located at the panel-partition PT2', and the break BRK3 is now located at the panel-partition PT3'. In consequence, the original comparison table orgTbl and the new comparison table newTbl in FIG. 22 are different from those in FIG. 20.

Please refer to FIGS. 16 and 22 together. Based on the original comparison table origTbl, the original leakage currents origLkg(PT1), origLkg(PT2) are both greater than 4 mA, and the reference leakage current refLkg is 2 mA. Moreover, the original leakage current origLkg(PT3) is 4 mA, and the original leakage current origLkg origLkg(PT4) is 2 mA. Based on the new comparison table newTbl, the new leakage currents newLkg(PT1), newLkg(PT2) are both greater than 4 mA. Moreover, the new leakage current newLkg(PT3) is 4 mA, and the new leakage current newLkg origLkg(PT4) is 2 mA. Therefore, the original comparison table origTbl and the new comparison table newTbl cannot be referred for recognizing states of the display panel.

For the panel-partition PT1, the reference leakage refLkg (2 mA) and the new leakage current newLkg(PT1) (>4 mA) are not equivalent. Thus, the determination result of step S317a' is negative, and the evaluation circuit further compares the new leakage current newLkg(PT1) (>4 mA) with the original leakage current origLkg(PT1) (>4 mA) (step S317c'). The determination result of step S317c' is positive so that the new leakage current newLkg(PT1) (>4 mA) is further compared with the majority leakage current majLkg(4 mA) (step S317h'). As the majority leakage current majLkg is not available, the determination result of step S317h' is considered as negative. Therefore, the evaluation circuit determines that the panel-partition PT1 is cracked by the external force, while the display panel is not in operation (step S317d').

For the panel-partition PT2, the reference leakage refLkg (2 mA) and the new leakage current newLkg(PT2) (>4 mA) are not equivalent. Thus, the determination result of step S317a' is negative, and the evaluation circuit further compares the new leakage current newLkg(PT2) (>4 mA) with the original leakage current origLkg(PT2) (>4 mA) (step S317c'). The determination result of step S317c' is positive so that the new leakage current newLkg(PT2) (>4 mA) is further compared with the majority leakage current majLkg(4 mA) (step S317h'). As the majority leakage current majLkg is not available, the determination result of step S317h' is considered as negative. Therefore, the evaluation circuit determines that the panel-partition PT2 is cracked by the external force, while the display panel is not in operation (step S317d').

For the panel-partition PT3, the reference leakage refLkg (3 mA) and the new leakage current newLkg(PT3) (4 mA) are not equivalent. Thus, the determination result of step S317a' is negative, and the evaluation circuit further compares the new leakage current newLkg(PT3) (4 mA) with the original leakage current orgLkg(PT3) (4 mA) (step S317c'). The determination result of step S317c' is positive so that the new leakage current newLkg(PT1) (4 mA) is further compared with the majority leakage current majLkg(NA) (step S317h'). As the majority leakage current majLkg is not available, the determination result of step S317h' is considered as negative. Therefore, the evaluation circuit determines that the panel-partition PT1 is cracked by the external force, while the display panel is not in operation (step S317d').

For the panel-partition PT4, the reference leakage refLkg (2 mA) and the new leakage current newLkg(PT4) (4 mA) are equivalent. Thus, the determination result of step S317a' is positive, and the evaluation circuit determines that the panel-partition PT4 is not cracked (step S317b').

Please refer to FIGS. 19, 20, 21, and 22 together. FIG. 19 shows that the evaluation circuit is not able to estimate the leakage current in some extreme cases. However, by changing the partition configuration, the evaluation circuit is still able to recognize the abnormal leakage current. In both the partition configurations shown in FIGS. 19 and 21, the display panels are in divided into 4 panel-partitions. Whereas, the source lines in the panel-partitions in FIG. 19 are different from those in FIG. 21. According to the embodiment of the present disclosure, the display panel may be designed to support different partition configurations simultaneously. The partition configurations are then alternatively adapted for estimation during the leakage estimation procedure. Consequentially, the chance of not being able to correctly detect the leakage current can be decreased significantly. In FIG. 21, the display panel supporting two types of partition configurations is shown. For the sake of illustration, each partition configuration is assumed to include only two panel-partitions. The implementation of the partition configurations having a different number of panel-partitions is similar.

FIG. 22 is a schematic diagram illustrating the original comparison table origTbl and the new comparison table newTbl corresponding to FIG. 21.

The original comparison table origTbl shows that the original leakage current origLkg(PT1) is greater than 4 mA, the original leakage current origLkg(PT2) is greater than 4 mA, the original leakage current origLkg(PT3) is determined to be 4 mA, and the original leakage current origLkg (PT4) is determined to be 2 mA. Moreover, the reference leakage current refLkg is determined to be 2 mA.

The new comparison table newTbl shows that the new leakage current newLkg(PT1) is greater than 4 mA, the new leakage current newLkg(PT2) is greater than 4 mA, the new leakage current newLkg(PT3) is determined to be 4 mA, and the new leakage current newLkg(PT4) is determined to be 2 mA. Based on the original comparison table origTbl and the new comparison table newTbl, the majority leakage current majLkg is greater than 4 mA.

Figure 23:
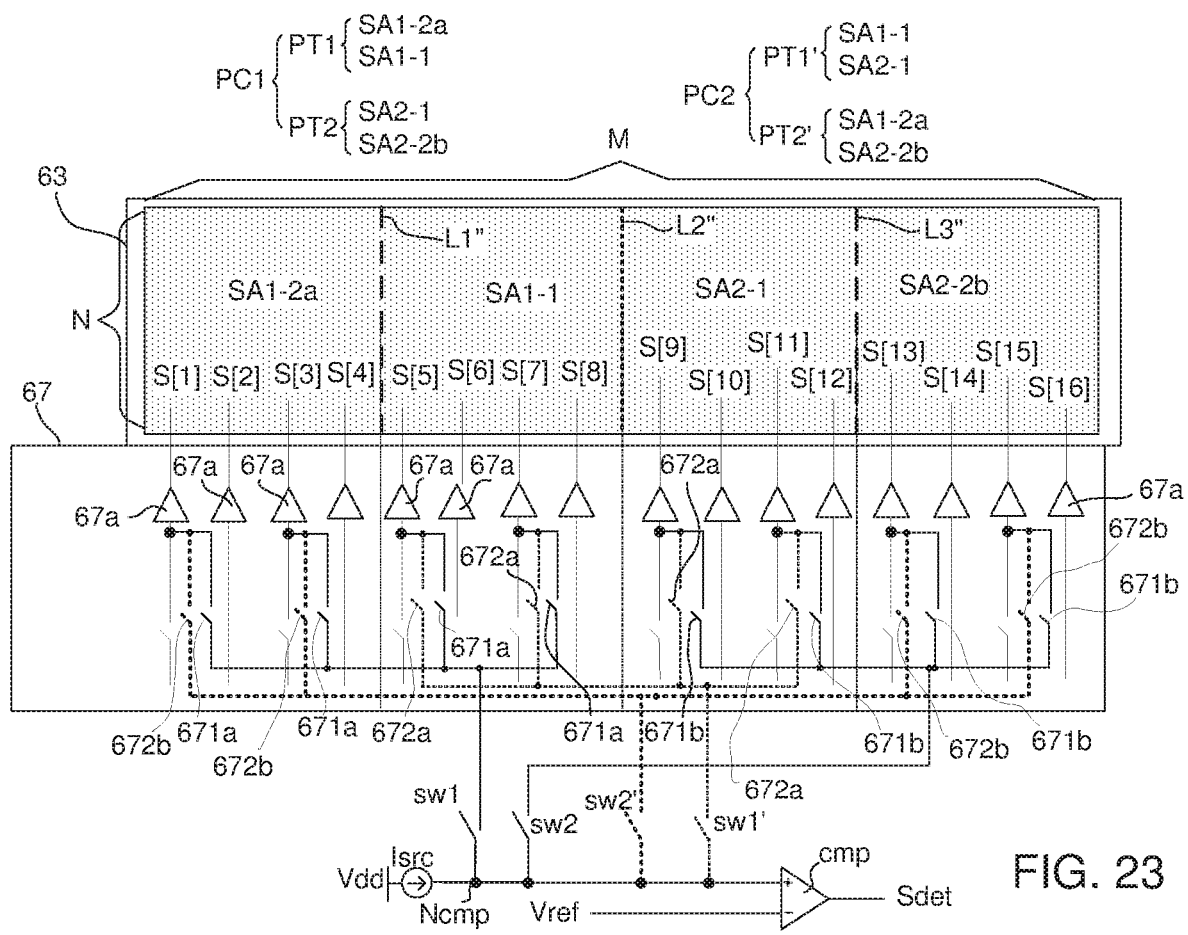
FIG. 23 is a schematic diagram illustrating that some modifications are applied to the source control circuit when the leakage estimation circuit simultaneously supports the leakage estimation function of two partition configurations.

FIG. 23 is a schematic diagram illustrating that some modifications are applied to the source control circuit when the leakage estimation circuit simultaneously supports the leakage estimation function of two partition configurations. For illustration purpose, the display panel 63 is assumed to include 16 channels, and the source control circuit 67 includes 16 source drivers 67a, which are respectively electrically connected to the source lines S[1]~S[16].

The boundary lines L1″, L2″, L3″ collectively divide the display panel 63 into four screen portions SA1-2a, SA1-1, SA2-1, SA2-2b. The screen portion SA1-2a is corresponding to source lines S[1]~S[4], the screen portion SA1-1 is corresponding to source lines S[5]~S[8], the screen portion SA2-1 is corresponding to source lines S[9]~S[12], and the screen portion SA2-2b is corresponding to source lines S[13]~S[16].

The display panel 63 can be defined by two partition configurations PC1, PC2. Each of the partition configurations PC1, PC2 is corresponding to dividing the display panel 63 into two panel-partitions. Each panel-partition in the partition configuration PC1 is partially overlapped with each panel-partition in the partition configuration PC2. For the sake of illustrations, the sizes of the panel-partitions are assumed to be equal. However, the sizes of the panel-partitions and the overlapped areas of the panel-partitions in different partition configurations might not be the same.

According to the partition configuration PC1, two panel-partitions PT1, PT2 are defined. When the partition configuration PC1 is adapted, one of the mode-switches sw1, sw2 is turned on. When the mode-switch sw1 is turned on, the leakage estimation procedure is performed to the panel-partition PT1. When the mode-switch sw2 is turned on, the leakage estimation procedure is performed to the panel-partition PT2.

The panel-partition PT1 includes screen portion SA1-2a, SA1-1, and the panel-partition PT2 includes screen portions SA-1, SA2-2b. Alternatively speaking, the panel-partition PT1 includes source drivers used for providing data voltages to the pixels located at the first column to the eighth column through the source lines S[1]~S[8], and the panel partition PT2 includes source drivers used for providing data voltages to the pixels located at the ninth column to the sixteenth column through the source lines S[9]~S[16].

According to the partition configuration PC2, another two panel-partitions PT1', PT2' are defined. When the partition configuration PC2 is adapted, one of the mode-switches sw1', sw2' is turned on. When the mode-switch sw1' is turned on, the leakage estimation procedure is performed to the panel-partition PT1'. When the mode-switch sw2' is turned on, the leakage estimation procedure is performed to the panel-partition PT2'.

The panel-partition PT1' includes screen portions SA1-1, SA2-1, and the panel-partition PT2' includes screen portions SA1-2a, SA2-2b. Alternatively speaking, the panel-partition PT1' includes source drivers used for providing data voltages to the pixels located at the fifth to the twelfth columns through the source lines S[5]~S[12], and the panel partition PT2' includes source drivers used for providing data voltages to pixels located at the first column to the fourth column and the pixels located at the thirteenth column to the sixteenth column through the source lines S[1]~S[4], S[13]~S[16].

The screen portion SA1-2a is considered as a part of the panel partition PT1 when the partition configuration PC1 is adapted, or as a part of the panel partition PT2' when the partition configuration PC2 is adapted. Therefore, two groups of detection-switches 671a, 672b are provided on the screen portion SA1-2a. The detection-switches 671a are used when the partition configuration PC1 is adapted because they can selectively connect the source drivers 67a belonging to the screen portion SA1-2a to the mode-switch sw1. On the other hand, the detection-switches 672b are used when the partition configuration PC2 is adapted because they can selectively connect the source drivers 67a belonging to the screen portion SA1-2a to the mode-switch sw2'.

The screen portion SA1-1 is considered as a part of the panel partition PT1 when the partition configuration PC1 is adapted, or as part of the panel partition PT1' when the partition configuration PC2 is adapted. Therefore, two groups of detection-switches 671a, 672a are provided in the screen portion SA1-1. The detection-switches 671a are used when the partition configuration PC1 is adapted because they can selectively connect the source drivers 67a belonging to the screen portion SA1-1 to the mode-switch sw1. The detection-switches 672a are used when the partition configuration PC2 is adapted because they can selectively connect the source drivers 67a belonging to the screen portion SA1-1 to the mode-switch sw1'.

The screen portion SA2-1 is considered as a part of the panel partition PT2 when the partition configuration PC1 is adapted, or as part of the panel partition PT1' when the partition configuration PC2 is adapted. Therefore, two groups of detection-switches 671b, 672a are provided in the screen portion SA2-1. The detection-switches 671b are used when the partition configuration PC1 is adapted because they can selectively connect the source drivers 67a belonging to the screen portion SA2-1 to the mode-switch sw1. The detection-switches 672a are used when the partition configuration PC2 is adapted because they can selectively connect the source drivers 67a belonging to the screen portion SA2-1 to the mode-switch sw1'.

The screen portion SA2-2b is considered as a part of the panel partition PT2 when the partition configuration PC1 is adapted, or as part of the panel partition PT2' when the partition configuration PC2 is adapted. Therefore, two groups of detection-switches 671b, 672b are provided on the screen portion SA2-2b. The detection-switches 671b are used when the partition configuration PC1 is adapted because they can selectively connect the source drivers 67a belonging to the screen portion SA2-2b to the mode-switch sw2. The detection-switches 672b are used when the partition configuration PC2 is adapted because they can selectively connect the source drivers 67a belonging to the screen portion SA2-2b to the mode-switch sw2'.

Once the two partition configurations PC1, PC2 are provided simultaneously and the panel-partitions defined in both partition configuration PC1, PC2 are alternatively detected by the evaluation circuit, the chance of not being able to find the leakage current is extremely low. Details about the layout of the partition configurations PC1, PC2 show in FIG. 24 are summarized in Table 2.

TABLE 2

| partition configuration | panel-partition | mode-switch | screen portion | source lines |
|---|---|---|---|---|
| partition configuration PC1 (without coordinate shift) | panel-partition PT1 | sw1 | SA1-2a, SA1-1 | S[1]~S[M/2] |
| | panel-partition PT2 | sw2 | SA2-1, SA2-2b | S[M/2 + 1]~S[M] |
| partition configuration PC2 (with coordinate shift) | panel-partition PT1' | sw1' | SA1-1, SA2-1 | S[M/4]~S[M/4 * 3] |
| | panel-partition PT2' | sw2' | SA1-2a, SA2-2b | S[1]~S[M/4], S[M/4 * 3 + 1]~S[M]. |

In the above illustrations, the evaluation circuit recognizes the minimum of testing current values tstC that causes the detected signal Sdet to switch to state "1" as the leakage current i_Lkg. However, the estimated leakage current i_Lkg based on such an approach might be inaccurate in some occasions. The cause of the inaccurate estimation can be, for example, instantaneous signal fluctuation of the detected signal Sdet.

For example, in a case that the actual leakage current i_Lkg is 4 mA, the detected signal Sdet should remain at state "0" while the source current Isrc is set to the testing current values tst1=1 mA, tst2=2 mA, or tst3=3 mA. However, during the leakage estimation procedure, the detected signal Sdet is somehow affected by instantaneous signal fluctuation and transits to state "1" when the testing current value tst1=1 mA.

If the above-mentioned approach is adapted, the leakage current i_Lkg will be recognized as 1 mA, which is incorrect. Actually, the detected signal Sdet might transit to state "0" when the testing current values tst2=2 mA or tst3=3 mA is applied. Therefore, the recognition rule of the leakage current i_Lkg to be detected can be further modified to avoid misjudgment of the leakage current i_Lkg. FIGS. 25A and 25B are examples showing an alternative way to estimate the leakage current i_Lkg.

The dotted circles c1, c2, c3, c4 in FIG. 25A and the dotted circles c1', c2', c3', c4' in FIG. 25B indicate the alternative way to recognize the leakage current i_Lkg. In FIGS. 25A and 25B, the evaluation circuit considers the leakage current i_Lkg to be detected to be equivalent to the second continuous and minimum testing current values which cause the detected signal Sdet to change to state "1". Alternatively speaking, the evaluation circuit recognizes the leakage current i_Lkg only when the detected signal Sdet has two continuous states "1". Adoption of such a relatively strict requirement can prevent the evaluation circuit from estimating the leakage current i_Lkg incorrectly.

In the above example, the current setting signal Sset is set by 2 bits, and four different testing current values tstC (1 mA~4 mA, with a gap of 1 mA) are used. In practical application, the source current Isrc can be set by the current setting signal Sset having more bits. In FIGS. 25A and 25B, an example of the current setting signal Sset having a length of 6-bits is utilized for identifying the leakage current i_Lkg. By adapting the 6-bit current setting signal Sset, 64 different testing current values tstC (1 mA~32 mA, with a gap of every 0.5 mA) are used.

FIG. 24A is a schematic diagram illustrating an exemplary original comparison table origTbl representing 32 testing current values are utilized in response to the current setting signal Sset having a length of 6-bits four panel-partitions generated. In FIG. 25A, the dotted circle c1 shows that the detected signal Sdet switches to state "1" when the source current Isrc is set to any of the testing current values 2.5 mA~32 mA, and the detected signal Sdet switches to state "0" when the source current Isrc is set to any of the other testing current values 0.5 mA~2 mA. Although the state of the detected signal Sdet changes from "0" to "1" when the testing current value tstC changes from 2 mA to 2.5 mA, the evaluation circuit does not directly recognize the original leakage current orgLkg(PT1) as 2 mA. Instead, the evaluation circuit identifies the original leakage current orgLkg(PT1) as 3 mA, which is the second testing current value that causes the detected signal Sdet to change to state "1". Similarly, the dotted circles c2, c3, c4 respectively indicate the original leakage currents orgLkg(PT2)=3.5 mA, orgLkg(PT3)=3.5 mA, orgLkg(PT4)=4 mA. Moreover, the reference leakage current refLkg is 3 mA.

FIG. 24B is a schematic diagram illustrating an exemplary new comparison table newTble representing that 32 testing current values are utilized in response to the current setting signal Sset having a length of 6-bits. The dotted circles c1', c2', c3', c4' in FIG. 25B indicate the new leakage currents newLkg(PT1)=3 mA, newLkg(PT2)=6.5 mA, newLkg(PT3)=3.5 mA, newLkg(PT4)=31 mA. As new leakage currents newLkg(PT1), newLkg(PT2), newLkg(PT3), newLkg(PT4) are different the majority leakage current majLkg is not available. Similar to the above illustrations, the detection results shown in FIGS. 24A and 24B can be compared based on FIG. 16. Details are omitted to avoid redundancy.

According to the embodiments of the present disclosure, a display device and associated detection method capable of determining whether short circuit occurs at the display panel are provided. If the short circuit exists and the display panel is under the risk of burnt out, the display device can be automatically turned off by the timing controller. Then, the user may send the display panel for repair, so the self-detection and protection mechanism can provide safety. In a case that the short circuit related to the gate line(s), the comparison voltage Vcmp may drop dramatically. In a case that the shortage is related to the source line(s), dropping of the comparison voltage Vcmp is relatively non-obvious. Thus, it is possible to diagnose the cause/occasion of the short circuit.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A display device, comprising:
  a display panel, comprising a plurality of pixels being arranged in M columns, wherein at least one panel-partition is defined on the display panel;

a source control circuit, electrically connected to the display panel, comprising M source drivers which respectively provide data voltages to the M columns of pixels; and a leakage estimation circuit, comprising:
an evaluation circuit;
a defect detection circuit, electrically connected to the evaluation circuit; and
at least one mode-switch, electrically connected to the defect detection circuit and the source control circuit, wherein the evaluation circuit controls the defect detection circuit to perform a leakage estimation procedure so that a leakage current corresponding to the at least one panel-partition is estimated when the at least one mode-switch is turned on.

2. The display device according to claim 1, wherein the source control circuit comprises:
M/2 channel-switches, electrically connected to a timing controller and M/2 source drivers among the M source drivers; and
M/2 detection-switches, electrically connected to the at least one mode-switch and the other M/2 source drivers among the M source drivers.

3. The display device according to claim 2, wherein
the M/2 channel-switches are electrically connected to odd-numbered source drivers among the M source drivers; and
the M/2 detection-switches are electrically connected to even-numbered source drivers among the M source drivers.

4. The display device according to claim 2, wherein
the M/2 channel-switches are electrically connected to even-numbered source drivers among the M source drivers; and
the M/2 detection-switches are electrically connected to odd-numbered source drivers among the M source drivers.

5. The display device according to claim 1, wherein
the leakage estimation procedure is performed soon after the display device is just power on, wherein a plurality of original-detected signals are generated in the leakage estimation procedure; or
the leakage estimation procedure is performed during a blank duration when the display device continuously displays images, wherein a plurality of new-detected signals are generated in the leakage estimation procedure.

6. The display device according to claim 5, wherein
the evaluation circuit determines whether the at least one panel-partition is cracked based on the plurality of original-detected signals and the plurality of new-detected signals.

7. The display device according to claim 6, wherein
an original leakage current corresponding to the at least one panel-partition is determined based on the plurality of original-detected signals; and
a new leakage current corresponding to the at least one panel-partition is determined based on the plurality of new-detected signals,
wherein the evaluation circuit determines when the at least one panel-partition is cracked based on comparison between the original leakage current and the new leakage current.

8. The display device according to claim 7, wherein the evaluation circuit determines whether the at least one panel-partition is cracked based on comparison between the new leakage current with a reference leakage current.

9. The display device according to claim 8, wherein
the reference leakage current is determined based on the plurality of original-detected signals; or
the reference leakage current is provided by a pre-stored circuit being electrically connected to the evaluation circuit.

10. The display device according to claim 5, wherein the leakage estimation circuit further comprises:
a storage circuit, electrically connected to the evaluation circuit,
wherein states of the plurality of original-detected signals and states of the plurality of new-detected signal are stored at the storage circuit.

11. The display device according to claim 5, wherein the evaluation circuit is electrically connected to a timing controller, wherein the evaluation circuit sends a warning signal to inform the timing controller if the display panel is determined to be cracked.

12. The display device according to claim 11, wherein the timing controller sends a mode control signal to the evaluation circuit to trigger the leakage estimation procedure.

13. The display device according to claim 1, wherein the defect detection circuit comprises:
a current source, electrically connected to the at least one mode-switch through a comparison terminal; and
a comparator, electrically connected to the comparison terminal, a reference voltage, and the evaluation circuit, wherein the comparator transmits a detected signal to the evaluation circuit when the at least one mode-switch is turned on.

14. The display device according to claim 13, wherein a voltage of the comparison terminal is related to the leakage current corresponding to the at least one panel-partition.

15. The display device according to claim 13, wherein the current source provides a source current, wherein the evaluation circuit sets the source current with a plurality of testing current values in the leakage estimation procedure.

16. The display device according to claim 1, wherein
the at least one panel-partition comprises J panel-partitions,
the source control circuit comprises J source-control partitions which are respectively corresponding to the J panel-partitions, wherein each of the J source-control partitions comprises $M/(2*J)$ channel-switches, and
the at least one mode-switch comprises J mode-switches, wherein a j-th mode-switch among the J mode-switches is electrically connected to the $M/(2*J)$ channel-switches of a j-th source-control partition, wherein J and j are positive integers, and j is smaller than or equivalent to J.

17. The display device according to claim 16, wherein in the leakage estimation procedure, the j-th mode-switch and the $M/(2*J)$ channel-switches of the j-th source-control partition are turned on when the evaluation circuit estimates the leakage current corresponding to the j-th panel-partition.

18. A detection method being applied to a display panel, on which at least one panel-partition is defined, wherein the detection method comprises steps of:
turning on at least one mode-switch, wherein a source control circuit is electrically connected to the display panel and the at least one mode-switch; and
controlling a leakage estimation circuit to perform a leakage estimation procedure so that a leakage current corresponding to the at least one panel-partition is estimated.

19. The detection method according to claim 18, wherein
the leakage estimation procedure is performed soon after the display panel is just power on, and a plurality of original-detected signals are generated in the leakage estimation procedure; or
the leakage estimation procedure is performed during a blank duration when the display panel continuously displays images, and a plurality of new-detected signals are generated in the leakage estimation procedure.

20. The detection method according to claim 19, further comprising a step of:
determining whether the at least one panel-partition is cracked based on the plurality of original-detected signals and the plurality of new-detected signals.

* * * * *